US008184817B2

(12) United States Patent
Takagi et al.

(10) Patent No.: US 8,184,817 B2
(45) Date of Patent: May 22, 2012

(54) MULTI-CHANNEL ACOUSTIC SIGNAL PROCESSING DEVICE

(75) Inventors: Yoshiaki Takagi, Kanagawa (JP); Kok Seng Chong, Singapore (SG); Takeshi Norimatsu, Hyogo (JP); Shuji Miyasaka, Osaka (JP); Akihisa Kawamura, Osaka (JP); Kojiro Ono, Osaka (JP)

(73) Assignee: Panasonic Corporation, Osaka (JP)

( * ) Notice: Subject to any disclaimer, the term of this patent is extended or adjusted under 35 U.S.C. 154(b) by 1121 days.

(21) Appl. No.: 12/064,975

(22) PCT Filed: Jul. 7, 2006

(86) PCT No.: PCT/JP2006/313574

§ 371 (c)(1), (2), (4) Date: Feb. 27, 2008

(87) PCT Pub. No.: WO2007/029412

PCT Pub. Date: Mar. 15, 2007

(65) Prior Publication Data

US 2009/0262949 A1 Oct. 22, 2009

(30) Foreign Application Priority Data

Sep. 1, 2005 (JP) ................................ 2005-253837

(51) Int. Cl.
*H03G 3/00* (2006.01)

(52) U.S. Cl. ................ 381/63; 381/77; 381/20; 381/22; 381/23

(58) Field of Classification Search .................... 381/63, 381/77, 15, 61, 22, 20, 17, 23, 107, 106, 381/104

See application file for complete search history.

(56) References Cited

U.S. PATENT DOCUMENTS

| | | | | |
|---|---|---|---|---|
| 4,887,297 | A * | 12/1989 | Loughlin | 381/15 |
| 5,463,424 | A * | 10/1995 | Dressler | 348/485 |
| 6,246,760 | B1 | 6/2001 | Makino et al. | |
| 6,463,410 | B1 | 10/2002 | Fuchigami et al. | |

(Continued)

FOREIGN PATENT DOCUMENTS

| | | |
|---|---|---|
| EP | 1 107 232 | 6/2001 |

(Continued)

OTHER PUBLICATIONS

International Search Report issued Oct. 10, 2006 in the International (PCT) Application of which the present application is the U.S. National Stage.

(Continued)

*Primary Examiner* — Thinh T Nguyen

(74) *Attorney, Agent, or Firm* — Wenderoth, Lind & Ponack, L.L.P.

(57) ABSTRACT

Provided is a multi-channel acoustic signal processing device by which loads of arithmetic operations are reduced. The multi-channel acoustic signal processing device includes: a decorrelated signal generation unit, and a matrix operation unit and a third arithmetic unit. The decorrelated signal generation unit generates a decorrelated signal w' indicating a sound which includes a sound indicated by an input signal x and reverberation, by performing reverberation processing on the input signal x. The matrix operation unit and the third arithmetic unit generate audio signals of m channels, by performing arithmetic operation on the input signal x and the decorrelated signal w' generated by the decorrelated signal generation unit, using a matrix $R_3$ which indicates distribution of a signal intensity level and distribution of reverberation.

10 Claims, 19 Drawing Sheets

U.S. PATENT DOCUMENTS

| | | | |
|---|---|---|---|
| 6,539,357 | B1 | 3/2003 | Sinha |
| 6,678,652 | B2 | 1/2004 | Fuchigami et al. |
| 6,757,659 | B1 | 6/2004 | Tanaka et al. |
| 6,961,432 | B1 | 11/2005 | Sinha et al. |
| 7,031,905 | B2 | 4/2006 | Tanaka et al. |
| 7,039,583 | B2 | 5/2006 | Fuchigami et al. |
| 7,085,713 | B2 | 8/2006 | Fuchigami et al. |
| 7,092,876 | B2 | 8/2006 | Fuchigami et al. |
| 7,092,889 | B2 | 8/2006 | Fuchigami et al. |
| 7,103,555 | B2 | 9/2006 | Fuchigami et al. |
| 7,136,491 | B2 | 11/2006 | Fuchigami et al. |
| 7,219,053 | B2 | 5/2007 | Fuchigami et al. |
| 7,236,933 | B2 | 6/2007 | Fuchigami et al. |
| 7,240,014 | B2 | 7/2007 | Fuchigami et al. |
| 7,487,097 | B2 | 2/2009 | Engdegard et al. |
| 7,551,972 | B2 | 6/2009 | Tanaka et al. |
| 7,564,978 | B2 | 7/2009 | Engdegard et al. |
| 7,660,425 | B1 | 2/2010 | Reed et al. |
| 7,801,314 | B2 | 9/2010 | Fuchigami et al. |
| 7,979,148 | B2 | 7/2011 | Tanaka et al. |
| 8,005,555 | B2 | 8/2011 | Tanaka et al. |
| 8,005,556 | B2 | 8/2011 | Tanaka et al. |
| 8,005,557 | B2 | 8/2011 | Tanaka et al. |
| 2002/0091514 | A1 | 7/2002 | Fuchigami |
| 2002/0154783 | A1 | 10/2002 | Fincham |
| 2003/0219137 | A1 | 11/2003 | Fincham |
| 2004/0024588 | A1 | 2/2004 | Watson et al. |
| 2004/0105551 | A1 | 6/2004 | Fuchigami et al. |
| 2004/0105552 | A1 | 6/2004 | Fuchigami et al. |
| 2004/0105553 | A1 | 6/2004 | Fuchigami et al. |
| 2004/0105554 | A1 | 6/2004 | Fuchigami et al. |
| 2004/0107093 | A1 | 6/2004 | Fuchigami et al. |
| 2004/0107094 | A1 | 6/2004 | Fuchigami et al. |
| 2004/0107095 | A1 | 6/2004 | Fuchigami et al. |
| 2004/0107096 | A1 | 6/2004 | Fuchigami et al. |
| 2004/0153789 | A1 | 8/2004 | Fuchigami et al. |
| 2004/0220806 | A1 | 11/2004 | Tanaka et al. |
| 2004/0236583 | A1 | 11/2004 | Tanaka et al. |
| 2005/0129258 | A1 | 6/2005 | Fincham |
| 2005/0226426 | A1 | 10/2005 | Oomen et al. |
| 2006/0053018 | A1 | 3/2006 | Engdegard et al. |
| 2007/0053521 | A1 | 3/2007 | Fuchigami et al. |
| 2007/0121952 | A1 | 5/2007 | Engdegard et al. |
| 2008/0170711 | A1 * | 7/2008 | Breebaart et al. ............... 381/77 |
| 2009/0228286 | A1 | 9/2009 | Tanaka et al. |
| 2009/0228287 | A1 | 9/2009 | Tanaka et al. |
| 2009/0228288 | A1 | 9/2009 | Tanaka et al. |
| 2009/0228289 | A1 | 9/2009 | Tanaka et al. |
| 2009/0287495 | A1 | 11/2009 | Breebaart et al. |

FOREIGN PATENT DOCUMENTS

| | | |
|---|---|---|
| EP | 1 310 099 | 11/2005 |
| JP | 9-501286 | 2/1997 |
| JP | 10-093680 | 4/1998 |
| JP | 2000-308200 | 11/2000 |
| JP | 2001-144656 | 5/2001 |
| JP | 2001-175296 | 6/2001 |
| JP | 2001-209399 | 8/2001 |
| JP | 2002-368658 | 12/2002 |
| JP | 2003-500937 | 1/2003 |
| JP | 2004-506947 | 3/2004 |
| JP | 2004-521541 | 7/2004 |
| JP | 2005-523479 | 8/2005 |
| JP | 2006-524832 | 11/2006 |
| WO | 95/04442 | 2/1995 |
| WO | 02/065815 | 8/2002 |
| WO | 03/090207 | 10/2003 |
| WO | 03/090208 | 10/2003 |
| WO | 2004/097794 | 11/2004 |

OTHER PUBLICATIONS

ISO/IEC 14496-3: 2001 / FDAM2: 2004(E), 2004, pp. 48-67.

J. Herre et al., "The Reference Model Architecture for MPEG Spatial Audio Coding," Convention Paper 6447, Audio Engineering Society, May 2005, pp. 1/13-13/13.

Supplementary European Search Report issued Nov. 26, 2010 in corresponding European patent application No. EP 06 76 7984.

* cited by examiner

MULTI-CHANNEL ACOUSTIC SIGNAL PROCESSING DEVICE

TECHNICAL FIELD

The present invention relates to multi-channel acoustic signal processing devices which down-mix a plurality of audio signals and divide the resulting down-mixed signal into the original plurality of signals.

BACKGROUND ART

Conventionally, multi-channel acoustic signal processing devices have been provided which down-mix a plurality of audio signals into a down-mixed signal and divide the down-mixed signal into the original plurality of signals.

FIG. 1 is a block diagram showing a structure of such a multi-channel acoustic signal processing device.

The multi-channel acoustic signal processing device 1000 has: a multi-channel acoustic coding unit 1100 which performs spatial acoustic coding on a group of audio signals and outputs the resulting acoustic coded signals; and a multi-channel acoustic decoding unit 1200 which decodes the acoustic coded signals.

The multi-channel acoustic coding unit 1100 processes audio signals (audio signals L and R of two channels, for example) in units of frames which are indicated by 1024-samples, 2048-samples, or the like. The multi-channel acoustic coding unit 1100 includes a down-mix unit 1110, a binaural cue calculation unit 1120, an audio encoder unit 1150, and a multiplexing unit 1190.

The down-mix unit 1110 generates a down-mixed signal M in which audio signals L and R of two channels that are expressed as spectrums are down-mixed, by calculating an average of the audio signals L and R, in other words, by calculating M=(L+R)/2.

The binaural cue calculation unit 1120 generates binaural cue information by comparing the down-mixed signal M and the audio signals L and R for each spectrum band. The binaural cue information is used to reproduce the audio signals L and R from the down-mixed signal.

The binaural cue information indicates: inter-channel level/intensity difference (IID); inter-channel coherence/correlation (ICC); inter-channel phase/delay difference (IPD); and channel prediction coefficients (CPC).

In general, the inter-channel level/intensity difference (IID) is information for controlling balance and localization of audio, and the inter-channel coherence/correlation (ICC) is information for controlling width and diffusion of audio. Both of the information are spatial parameters to help listeners to imagine auditory scenes.

The audio signals L and R that are expressed as spectrums, and the down-mixed signal M are generally sectionalized into a plurality of groups including "parameter bands". Therefore, the binaural cue information is calculated for each of the parameter bands. Note that hereinafter the "binaural cue information" and "spatial parameter" are often used synonymously with each other.

The audio encoder unit 1150 compresses and codes the down-mixed signal M, according to, for example, MPEG Audio Layer-3 (MP3), Advanced Audio Coding (AAC), or the like.

The multiplexing unit 1190 multiplexes the down-mixed signal M and the quantized binaural cue information to generate a bitstream, and outputs the bitstream as the above-mentioned acoustic coded signals.

The multi-channel acoustic decoding unit 1200 includes an inverse-multiplexing unit 1210, an audio decoder unit 1220, an analysis filter unit 1230, a multi-channel synthesis unit 1240, and a synthesis filter unit 1290.

The inverse-multiplexing unit 1210 obtains the above-mentioned bitstream, divides the bitstream into the quantized BC information and the coded down-mixed signal M, and outputs the resulting binaural cue information and down-mixed signal M. Note that the inverse-multiplexing unit 1210 inversely quantizes the quantized binaural cue information, and outputs the resulting binaural cue information.

The audio decoder unit 1220 decodes the coded down-mixed signal M to be outputted to the analysis filter unit 1230.

The analysis filter unit 1230 converts an expression format of the down-mixed signal M into a time/frequency hybrid expression to be outputted.

The multi-channel synthesis unit 1240 obtains the down-mixed signal M from the analysis filter unit 1230, and the binaural cue information from the inverse-multiplexing unit 1210. Then, using the binaural cue information, the multi-channel synthesis unit 1240 reproduces two audio signals L and R from the down-mixed signal M to be in a time/frequency hybrid expression.

The synthesis filter unit 1290 converts the expression format of the reproduced audio signals from the time/frequency hybrid expression into a time expression, thereby outputting audio signals L and R in the time expression.

Although it has been described that the multi-channel acoustic signal processing device 1000 codes and decodes audio signals of two channels as one example, the multi-channel acoustic signal processing device 1000 is able to code and decode audio signals of more than two channels (audio signals of six channels forming 5.1-channel sound source, for example).

FIG. 2 is a block diagram showing a functional structure of the multi-channel synthesis unit 1240.

For example, in the case where the multi-channel synthesis unit 1240 divides the down-mixed signal M into audio signals of six channels, the multi-channel synthesis unit 1240 includes the first dividing unit 1241, the second dividing unit 1242, the third dividing unit 1243, the fourth dividing unit 1244, and the fifth dividing unit 1245. Note that, in the down-mixed signal M, a center audio signal C, a left-front audio signal $L_f$, a right-front audio signal $R_f$, a left-side audio signal $L_s$, a right-side audio signal $R_s$, and a low frequency audio signal LFE are down-mixed. The center audio signal C is for a loudspeaker positioned on the center front of a listener. The left-front audio signal $L_f$ is for a loudspeaker positioned on the left front of the listener. The right-front audio signal $R_f$ is for a loudspeaker positioned on the right front of the listener. The left-side audio signal $L_s$ is for a loudspeaker positioned on the left side of the listener. The right-side audio signal $R_s$ is for a loudspeaker positioned on the right side of the listener. The low frequency audio signal LFE is for a sub-woofer loudspeaker for low sound outputting.

The first dividing unit 1241 divides the down-mixed signal M into the first down-mixed signal $M_1$ and the fourth down-mixed signal $M_4$ in order to be outputted. In the first down-mixed signal $M_1$, the center audio signal C, the left-front audio signal $L_f$, the right-front audio signal $R_f$, and the low frequency audio signal LFE are down-mixed. In the fourth down-mixed signal $M_4$, the left-side audio signal $L_s$ and the right-side audio signal $R_s$ are down-mixed.

The second dividing unit 1242 divides the first down-mixed signal $M_1$ into the second down-mixed signal $M_2$ and the third down-mixed signal $M_3$ in order to be outputted. In the second down-mixed signal $M_2$, the left-front audio signal $L_f$ and the right-front audio signal $R_f$ are down-mixed. In the third down-mixed signal $M_3$, the center audio signal C and the low frequency audio signal LFE are down-mixed.

The third dividing unit 1243 divides the second down-mixed signal $M_2$ into the left-front audio signal $L_f$ and the right-front audio signal $R_f$ in order to be outputted.

The fourth dividing unit 1244 divides the third down-mixed signal $M_3$ into the center audio signal C and the low frequency audio signal LFE in order to be outputted.

The fifth dividing unit 1245 divides the fourth down-mixed signal $M_4$ into the left-side audio signal $L_s$ and the right-side audio signal $R_s$ in order to be outputted.

As described above, in the multi-channel synthesis unit 1240, each of the dividing units divides one signal into two signals using a multiple-stage method, and the multi-channel synthesis unit 1240 recursively repeats the signal dividing until the signals are eventually divided into a plurality of single audio signals.

FIG. 3 is a block diagram showing a structure of the binaural cue calculation unit 1120.

The binaural cue calculation unit 1120 includes a first level difference calculation unit 1121, a first phase difference calculation unit 1122, a first correlation calculation unit 1123, a second level difference calculation unit 1124, a second phase difference calculation unit 1125, a second correlation calculation unit 1126, a third level difference calculation unit 1127, a third phase difference calculation unit 1128, a third correlation calculation unit 1129, a fourth level difference calculation unit 1130, a fourth phase difference calculation unit 1131, a fourth correlation calculation unit 1132, a fifth level difference calculation unit 1133, a fifth phase difference calculation unit 1134, a fifth correlation calculation unit 1135, and adders 1136, 1137, 1138, and 1139.

The first level difference calculation unit 1121 calculates a level difference between the left-front audio signal $L_f$ and the right-front audio signal $R_f$, and outputs the signal indicating the inter-channel level/intensity difference (IID) as the calculation result. The first phase difference calculation unit 1122 calculates a phase difference between the left-front audio signal $L_f$ and the right-front audio signal $R_f$, and outputs the signal indicating the inter-channel phase/delay difference (IPD) as the calculation result. The first correlation calculation unit 1123 calculates a correlation between the left-front audio signal $L_f$ and the right-front audio signal $R_f$, and outputs the signal indicating the inter-channel coherence/correlation (ICC) as the calculation result. The adder 1136 adds the left-front audio signal $L_f$ and the right-front audio signal $R_f$ and multiplies the resulting added value by a predetermined coefficient, thereby generating and outputting the second down-mixed signal $M_2$.

In the same manner as described above, the second level difference calculation unit 1124, the second phase difference calculation unit 1125, and the second correlation calculation unit 1126 output signals indicating inter-channel level/intensity difference (IID), inter-channel phase/delay difference (IPD), and inter-channel coherence/correlation (ICC), respectively, regarding between the left-side audio signal $L_s$ and the right-side audio signal $R_s$. The adder 1137 adds the left-side audio signal $L_s$ and the right-side audio signal $R_s$ and multiplies the resulting added value by a predetermined coefficient, thereby generating and outputting the third down-mixed signal $M_3$.

In the same manner as described above, the third level difference calculation unit 1127, the third phase difference calculation unit 1128, and the third correlation calculation unit 1129 output signals indicating inter-channel level/intensity difference (IID), inter-channel phase/delay difference (IPD), and inter-channel coherence/correlation (ICC), respectively, regarding between the center audio signal C and the low frequency audio signal LFE. The adder 1138 adds the center audio signal C and the low frequency audio signal LFE and multiplies the resulting added value by a predetermined coefficient, thereby generating and outputting the fourth down-mixed signal $M_4$.

In the same manner as described above, the fourth level difference calculation unit 1130, the fourth phase difference calculation unit 1131, and the fourth correlation calculation unit 1132 output signals indicating inter-channel level/intensity difference (IID), inter-channel phase/delay difference (IPD), and inter-channel coherence/correlation (ICC), respectively, regarding between the second down-mixed signal $M_2$ and the third down-mixed signal $M_3$. The adder 1139 adds the second down-mixed signal $M_2$ and the third down-mixed signal $M_3$ and multiplies the resulting added value by a predetermined coefficient, thereby generating and outputting the first down-mixed signal $M_1$.

In the same manner as described above, the fifth level difference calculation unit 1133, the fifth phase difference calculation unit 1134, and the fifth correlation calculation unit 1135 output signals indicating inter-channel level/intensity difference (IID), inter-channel phase/delay difference (IPD), and inter-channel coherence/correlation (ICC), respectively, regarding between the first down-mixed signal $M_1$ and the fourth down-mixed signal $M_4$.

FIG. 4 is a block diagram showing a structure of the multi-channel synthesis unit 1240.

The multi-channel synthesis unit 1240 includes a pre-matrix processing unit 1251, a post-matrix processing unit 1252, a first arithmetic unit 1253, a second arithmetic unit 1255, and a decorrelated signal generation unit 1254.

Using the binaural cue information, the pre-matrix processing unit 1251 generates a matrix $R_1$ which indicates distribution of signal intensity level for each channel.

For example, using inter-channel level/intensity difference (IID) representing a ratio of a signal intensity level of the down-mixed signal M to respective signal intensity levels of the first down-mixed signal $M_1$, the second down-mixed signal $M_2$, the third down-mixed signal $M_3$, and the fourth down-mixed signal $M_4$, the pre-matrix processing unit 1251 generates a matrix $R_1$ including vector elements $R_1[0]$ to $R_1[4]$.

The first arithmetic unit 1253 obtains from the analysis filter unit 1230 the down-mixed signal M expressed by the time/frequency hybrid as an input signal x, and multiplies the input signal x by the matrix $R_1$ according to the following equations 1 and 2, for example. Then, the first arithmetic unit 1253 outputs an intermediate signal v that represents the result of the above matrix operation. In other words, the first arithmetic unit 1253 separates four down-mixed signals $M_1$ to $M_4$ from the down-mixed signal M expressed by the time/frequency hybrid outputted from the analysis filter unit 1230.

$$v = \begin{bmatrix} M \\ M_1 \\ M_2 \\ M_3 \\ M_4 \end{bmatrix} = \begin{bmatrix} R_1[0] \\ R_1[1] \\ R_1[2] \\ R_1[3] \\ R_1[4] \end{bmatrix} [M] = R_1 x \quad \text{[Equation 1]}$$

-continued $$M_1 = L_f + R_f + C + LFE$$
$$M_2 = L_f + R_f$$
$$M_3 = C + LFE$$
$$M_4 = L_s + R_s \quad \text{[Equation 2]}$$

The decorrelated signal generation unit 1254 performs all-pass filter processing on the intermediate signal v, thereby generating and outputting a decorrelated signal w according to the following equation 3. Note that factors $M_{rev}$ and $M_{i,rev}$ in the decorrelation signal w are signals generated by performing decorrelation processing on the down-mixed signal M and $M_i$. Note also that the signals $M_{rev}$ and $M_{i,rev}$ has the same energy as the down-mixed signal M and $M_i$, respectively, including reverberation that provides impression as if sounds were spread.

$$w = \begin{bmatrix} M \\ decorr(v) \end{bmatrix} = \begin{bmatrix} M \\ M_{rev} \\ M_{1,rev} \\ M_{2,rev} \\ M_{3,rev} \\ M_{4,rev} \end{bmatrix} \quad \text{[Equation 3]}$$

FIG. 5 is a block diagram showing a structure of the decorrelated signal generation unit 1254.

The decorrelated signal generation unit 1254 includes an initial delay unit 100 and an all-pass filter D200.

In obtaining the intermediate signal v, the initial delay unit D100 delays the intermediate signal v by a predetermined time period, in other words, delays a phase, in order to output the intermediate signal v to the all-pass filter D200.

For example, the post-matrix processing unit 1252 derives a mixing coefficient $H_{ij}$ from the inter-channel coherence/correlation ICC which represents width and diffusion of sound, and then generates the matrix $R_2$ including the mixing coefficient $H_{ij}$.

The second arithmetic unit 1255 multiplies the decorrelated signal w by the matrix $R_2$, and outputs an output signal y which represents the result of the matrix operation. In other words, the second arithmetic unit 1255 separates six audio signals $L_f$, $R_f$, $L_s$, $R_s$, C, and LFE from the decorrelated signal w.

For example, as shown in FIG. 2, since the left-front audio signal $L_f$ is divided from the second down-mixed signal $M_2$, the dividing of the left-front audio signal $L_f$ needs the second down-mixed signal $M_2$ and a factor $M_{2,rev}$ of a decorrelated signal w corresponding to the second down-mixed signal $M_2$. Likewise, since the second down-mixed signal $M_2$ is divided from the first down-mixed signal $M_1$, the dividing of the second down-mixed signal $M_2$ needs the first down-mixed signal $M_1$ and a factor $M_{1,rev}$ of a decorrelated signal w corresponding to the first down-mixed signal $M_1$.

Therefore, the left-front audio signal $L_f$ is expressed by the following equation 4.

$$L_f = H_{11,A} \times M_2 + H_{12,A} \times M_{2,rev}$$
$$M_2 = H_{11,D} \times M_1 + H_{12,D} \times M_{1,rev}$$
$$M_1 = H_{11,E} \times M + H_{12,E} \times M_{rev} \quad \text{[Equation 4]}$$

Here, in the equation 4, $H_{ij,A}$ is a mixing coefficient in the third dividing unit 1243, $H_{ij,D}$ is a mixing coefficient in the second dividing unit 1242, and $H_{ij,E}$ is a mixing coefficient in the first dividing unit 1241. The three equations in the equation 4 are expressed together by a vector multiplication equation of the following equation 5.

$$L_f = [H_{11,A}H_{11,D}H_{11,E} \;\; H_{11,A}H_{11,D}H_{12,E} \;\; H_{11,A}H_{12,D} \;\; H_{12,A} \;\; 0 \;\; 0] \begin{bmatrix} M \\ M_{rev} \\ M_{1,rev} \\ M_{2,rev} \\ M_{3,rev} \\ M_{4,rev} \end{bmatrix} \quad \text{[Equation 5]}$$

The all-pass filter D200 has all-pass characteristics that frequency-amplitude characteristics are not varied but only frequency-phase characteristics are varied, and serves as an Infinite Impulse Response (IIR).

This all-pass filter D200 includes multipliers D201 to D207, delayers D221 to D223, and adder-subtractors D211 to D223.

FIG. 6 is a graph of an impulse response of the decorrelated signal generation unit 1254.

As shown in FIG. 6, even if an impulse signal is obtained at a timing 0, the decorrelated signal generation unit 1254 delays the impulse signal not to be outputted until a timing t10, and outputs a signal as reverberation up to a timing t11 so that an amplitude of the signal is gradually decreased from the timing t10. In other words, the signals $M_{rev}$ and $M_{i,rev}$ outputted from the decorrelated signal generation unit 1254 represent sounds in which sounds of the down-mixed signal M and $M_i$ are added with the reverberation.

Using the binaural cue information, the post-matrix processing unit 1252 generates a matrix $R_2$ which indicates distribution of reverberation for each channel.

Each of the audio signals $R_f$, C, LFE, $L_s$, and $R_s$ other than the left-front audio signal $L_f$ is calculated by multiplication of the above-mentioned matrix by a matrix of the decorrelated signal w. That is, an output signal y is expressed by the following equation 6.

$$y = \begin{bmatrix} L_f \\ R_f \\ L_s \\ R_s \\ C \\ LFE \end{bmatrix} = \begin{bmatrix} R_{2,LF} \\ R_{2,RF} \\ R_{2,LS} \\ R_{2,RS} \\ R_{2,C} \\ R_{2,LFE} \end{bmatrix} w = R_2 w \quad \text{[Equation 6]}$$

FIG. 7 is an explanatory diagram for explaining the down-mixed signal.

The down-mixed signal is generally expressed by a time/frequency hybrid expression as shown in FIG. 7. This means that the down-mixed signal is expressed by being divided along a time axis direction into parameter sets ps which are temporal units, and further divided along a spatial axis direction into parameter bands pb which are sub-band units. Therefore, the binaural cue information is calculated for each band (ps, pb). Moreover, the pre-matrix processing unit 1251 and the post-matrix processing unit 1252 calculate a matrix $R_1$ (ps, pb) and a matrix $R_2$ (ps, pb), respectively, for each band (ps, pb).

FIG. 8 is a block diagram showing detailed structures of the pre-matrix processing unit 1251 and the post-matrix processing unit 1252.

The pre-matrix processing unit 1251 includes the matrix equation generation unit 1251*a* and the interpolation unit 1251*b*.

The matrix equation generation unit 1251*a* generates a matrix $R_1$ (ps, pb) for each band (ps, pb), from binaural cue information for each band (ps, pb).

The interpolation unit 1251*b* maps, in other words, interpolates, the matrix $R_1$ (ps, pb) for each band (ps, pb) according to (i) a frequency high resolution time index n and (ii) a sub-sub-band index sb which is of the input signal x and in a hybrid expression. As a result, the interpolation unit 1251*b* generates a matrix $R_1$ (n, sb) for each band (n, sb). As described above, the interpolation unit 1251*b* ensures that transition of the matrix $R_1$ over a boundary of a plurality of bands is smooth.

The post-matrix processing unit 1252 includes a matrix equation generation unit 1252*a* and an interpolation unit 1252*b*.

The matrix equation generation unit 1252*a* generates a matrix $R_2$ (ps, pb) for each band (ps, pb), from binaural cue information for each band (ps, pb).

The interpolation unit 2252*b* maps, in other words, interpolates, the matrix $R_2$ (ps, pb) for each band (ps, pb) according to (i) a frequency high resolution time index n and (ii) a sub-sub-band index sb of the input signal x of a hybrid expression. As a result, the interpolation unit 2252*b* generates a matrix $R_2$ (n, sb) for each band (n, sb). As described above, the interpolation unit 2252*b* ensures that transition of the matrix $R_2$ over a boundary of a plurality of bands is smooth.

[Non-Patent Document 1] J. Herre, et al., "The Reference Model Architecture for MPEG Spatial Audio Coding", 118th AES Convention, Barcelona

SUMMARY OF THE INVENTION

Problems that Invention is to Solve

However, the conventional multi-channel acoustic signal processing device has a problem of huge loads of arithmetic operations.

More specifically, arithmetic operation loads on the pre-matrix processing unit 1251, the post-matrix processing unit 1252, the first arithmetic unit 1253, and the second arithmetic unit 1255 of the conventional multi-channel synthesis unit 1240 become considerable amounts.

Therefore, the present invention is conceived to address the problem, and an object of the present invention is to provide a multi-channel acoustic signal processing device whose operation loads are reduced.

Means to Solve the Problems

In order to achieve the above object, the multi-channel acoustic signal processing device according to the present invention divides an input signal into audio signals of m channels, where m is larger than 1, the input signal being generated by down-mixing the audio signals. The multi-channel acoustic signal processing device includes: a decorrelated signal generation unit operable to generate a decorrelated signal by performing reverberation processing on the input signal, the decorrelated signal indicating a sound which includes a sound indicated by the input signal and reverberation; a matrix operation unit operable to generate the audio signals of the m channels by performing an arithmetic operation on the input signal and the decorrelated signal generated by the decorrelated signal generation unit, the arithmetic operation using a matrix which indicates distribution of a signal intensity level and distribution of the reverberation.

With the above structure, the arithmetic operations using the matrixes indicating distribution of signal intensity level and distribution of reverberation, after the generation of the decorrelated signal. Thereby, it is possible to perform together both of (i) the arithmetic operation using the matrix indicating the distribution of signal intensity level and (ii) the arithmetic operation using the matrix indicating the distribution of reverberation, without separating these arithmetic operations before and after the generation of the decorrelated signal in the conventional manner. As a result, the arithmetic operation loads can be reduced. More specifically, an audio signal which is divided by performing the processing of the distribution of the signal intensity level after the generation of the decorrelated signal is similar to an audio signal which is divided by performing the processing of the distribution of the signal intensity level prior to the generation of the decorrelated signal. Therefore, in the present invention, it is possible to perform the matrix operations together, by applying an approximation calculation. As a result, capacity of a memory used for the operations can be reduced, thereby downsizing the multi-channel acoustic signal processing device.

Further, the matrix operation unit may include: a matrix generation unit operable to generate an integrated matrix which indicates multiplication of a level distribution matrix by a reverberation adjustment matrix, the level distribution matrix indicating the distribution of the signal intensity level and the reverberation adjustment matrix indicating the distribution of the reverberation; and an arithmetic unit operable to generate the audio signals of the m channels by multiplying a matrix by the integrated matrix, the matrix being indicated by the decorrelated signal and the input signal, and the integrated matrix being generated by the matrix generation unit.

Thereby, only a single matrix operation using an integrated matrix is enough to divide audio signals of m channels from the input signal, thereby certainly reducing arithmetic operation loads.

Furthermore, the multi-channel acoustic signal processing device may further include a phase adjustment unit operable to adjust a phase of the input signal according to the decorrelated signal and the integrated matrix. For example, the phase adjustment unit may delay one of the integrated matrix and the input signal which vary as time passes.

Thereby, even if delay of the generation of the decorrelated signal occurs, a phase of the input signal is adjusted to perform an arithmetic operation on the decorrelated signal and the input signal using an appropriate integrated matrix, thereby appropriately outputting the audio signals of m channels.

Still further, the phase adjustment unit may delay one of the integrated matrix and the input signal, by a delay time period of the decorrelated signal generated by the decorrelated signal generation unit. Still further, the phase adjustment unit may delay one of the integrated matrix and the input signal, by a time period which is closest to a delay time period of the decorrelated signal generated by the decorrelated signal generation unit and required for processing an integral multiple of a predetermined processed unit.

Thereby, the delay amount of the integrated matrix or the input signal is substantially equivalent to the delay amount of the decorrelated signal, which makes it possible to perform the arithmetic operation using a more appropriate integrated matrix, thereby appropriately outputting audio signals of m channels.

Still further, the phase adjustment unit may adjust the phase when a pre-echo occurs more than a predetermined detection limit.

Thereby, it is possible to completely prevent detection of pre-echo.

Note that the present invention can be realized not only as the above multi-channel acoustic signal processing device, but also as an integrated circuit, a method, a program, and a storage medium in which the program is stored.

Effects of the Invention

The multi-channel acoustic signal processing device according to the present invention has advantages of reducing arithmetic operation loads. More specifically, according to the present invention, it is possible to reduce complexity of processing performed by a multi-channel acoustic decoder, without causing deformation of bitstream syntax or recognizable deterioration of sound quality.

NUMERICAL REFERENCES

Figure 1:
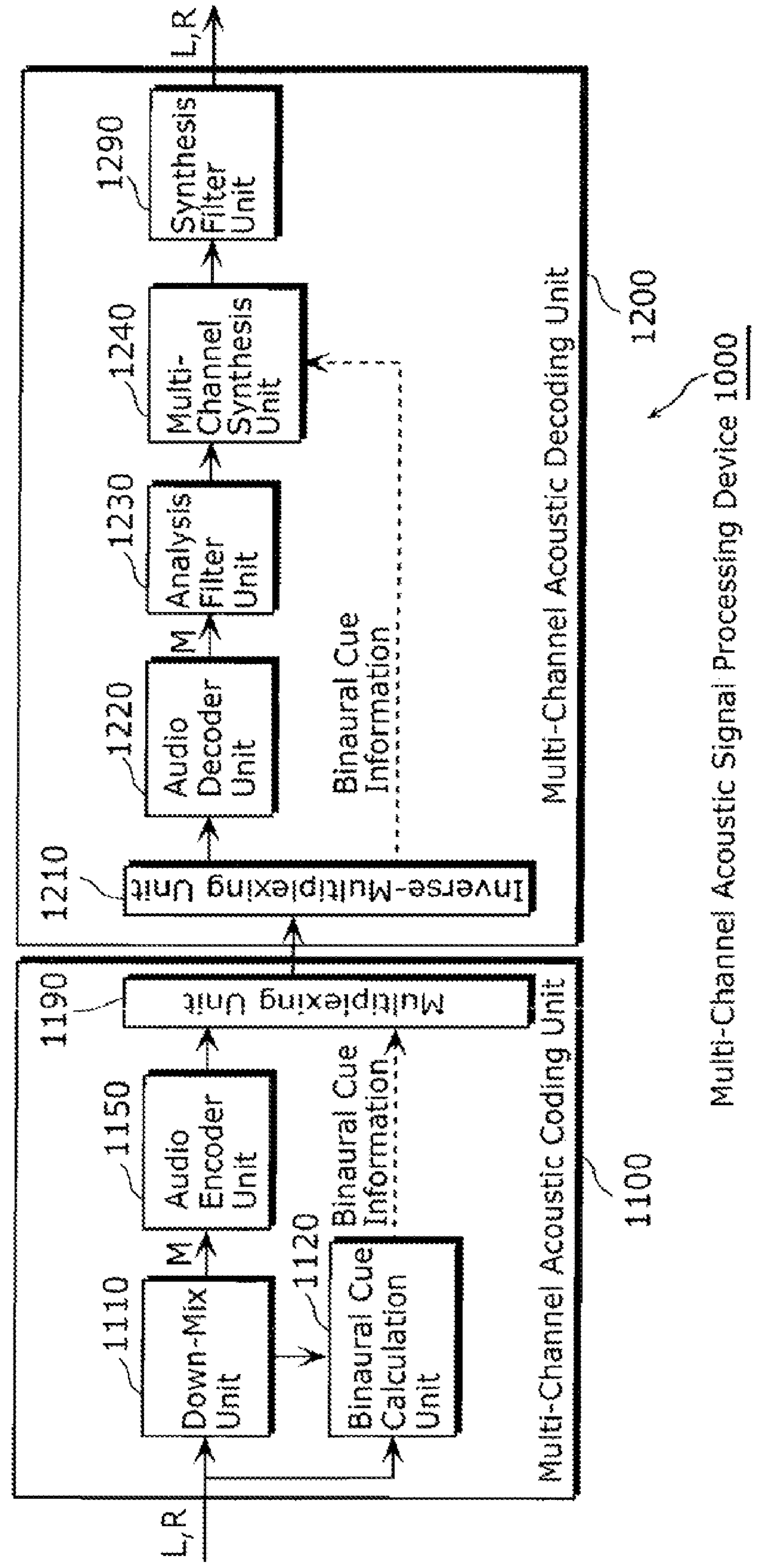
PRIOR ART FIG. 1
FIG. 1 is a block diagram showing a structure of the conventional multi-channel acoustic signal processing device.
Figure 2:
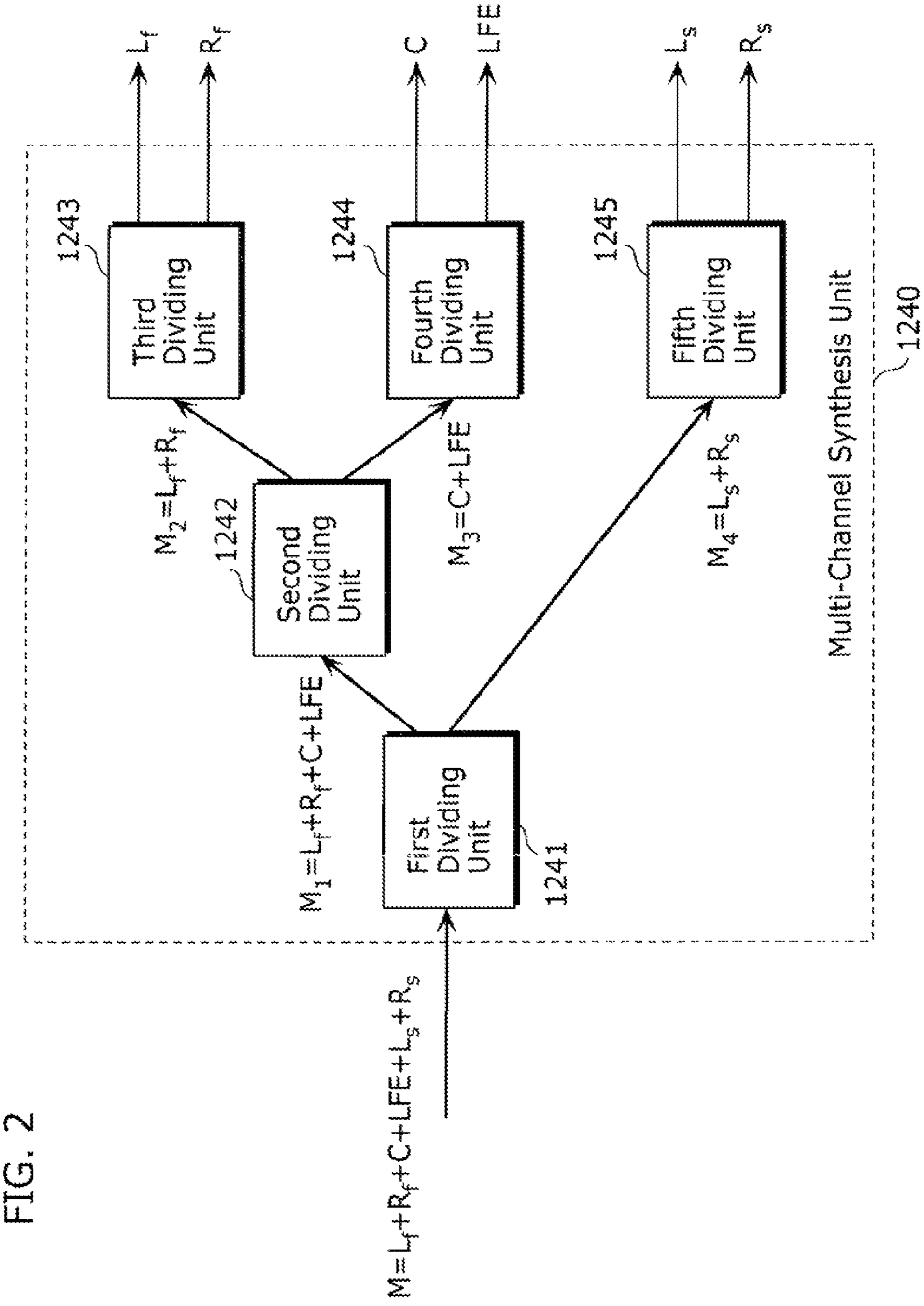
PRIOR ART FIG. 2
FIG. 2 is a block diagram showing a functional structure of the multi-channel synthesis unit of the conventional multi-channel acoustic signal processing device.
Figure 3:
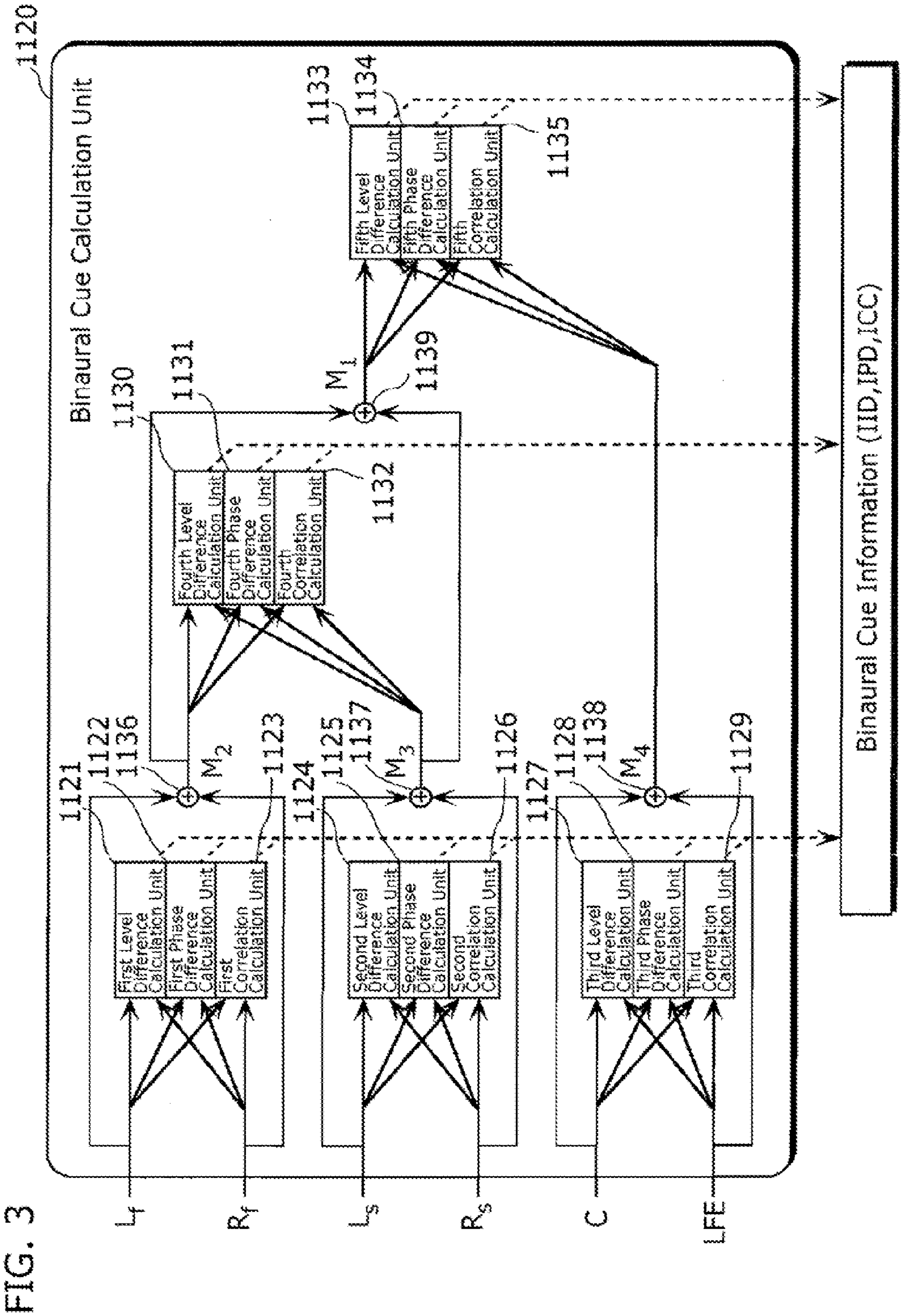
PRIOR ART FIG. 3
FIG. 3 is a block diagram showing a structure of the binaural cue calculation unit of the conventional multi-channel acoustic signal processing device.
Figure 4:
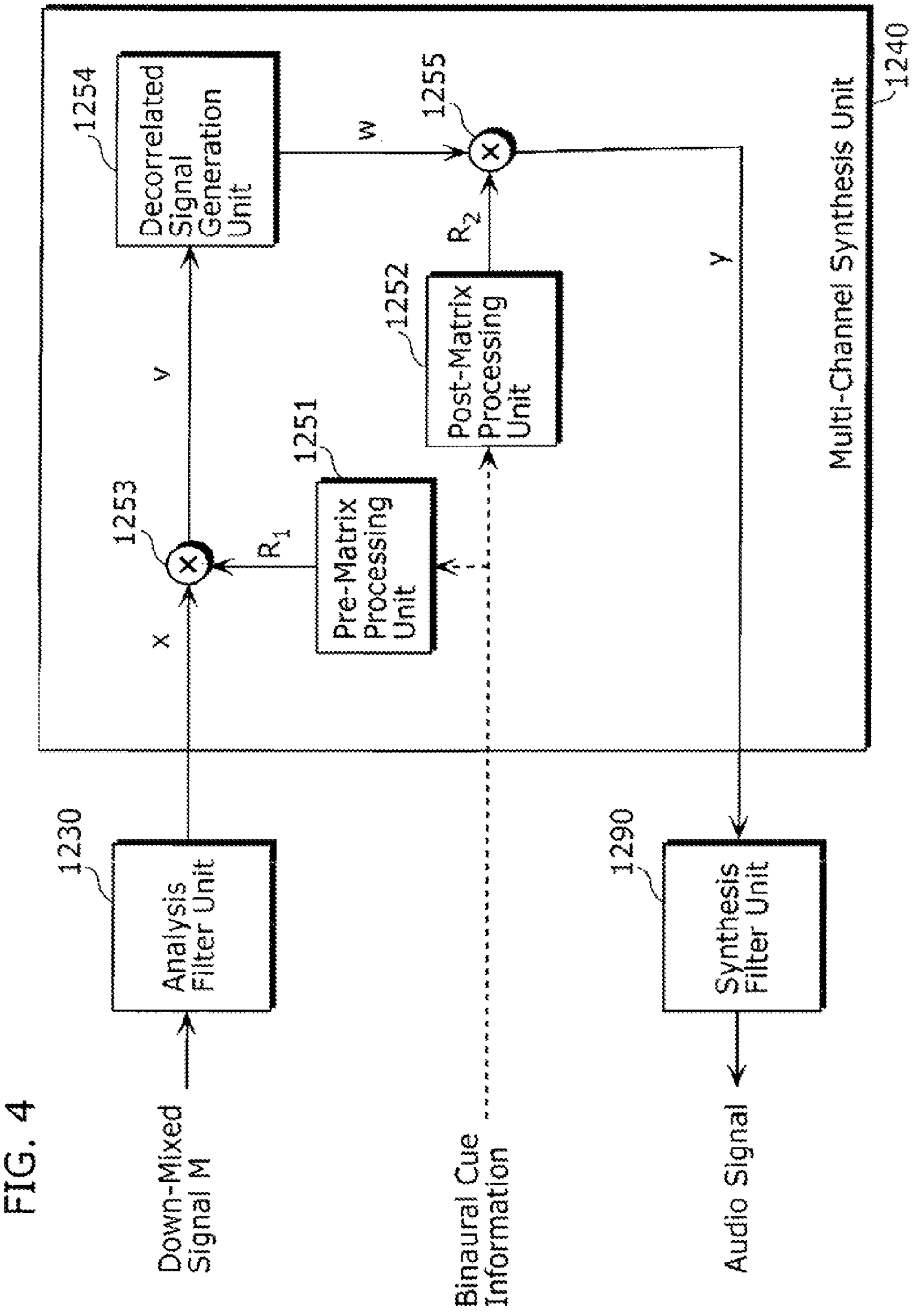
PRIOR ART FIG. 4
FIG. 4 is a block diagram showing a structure of the multi-channel synthesis unit of the conventional multi-channel acoustic signal processing device.
Figure 5:
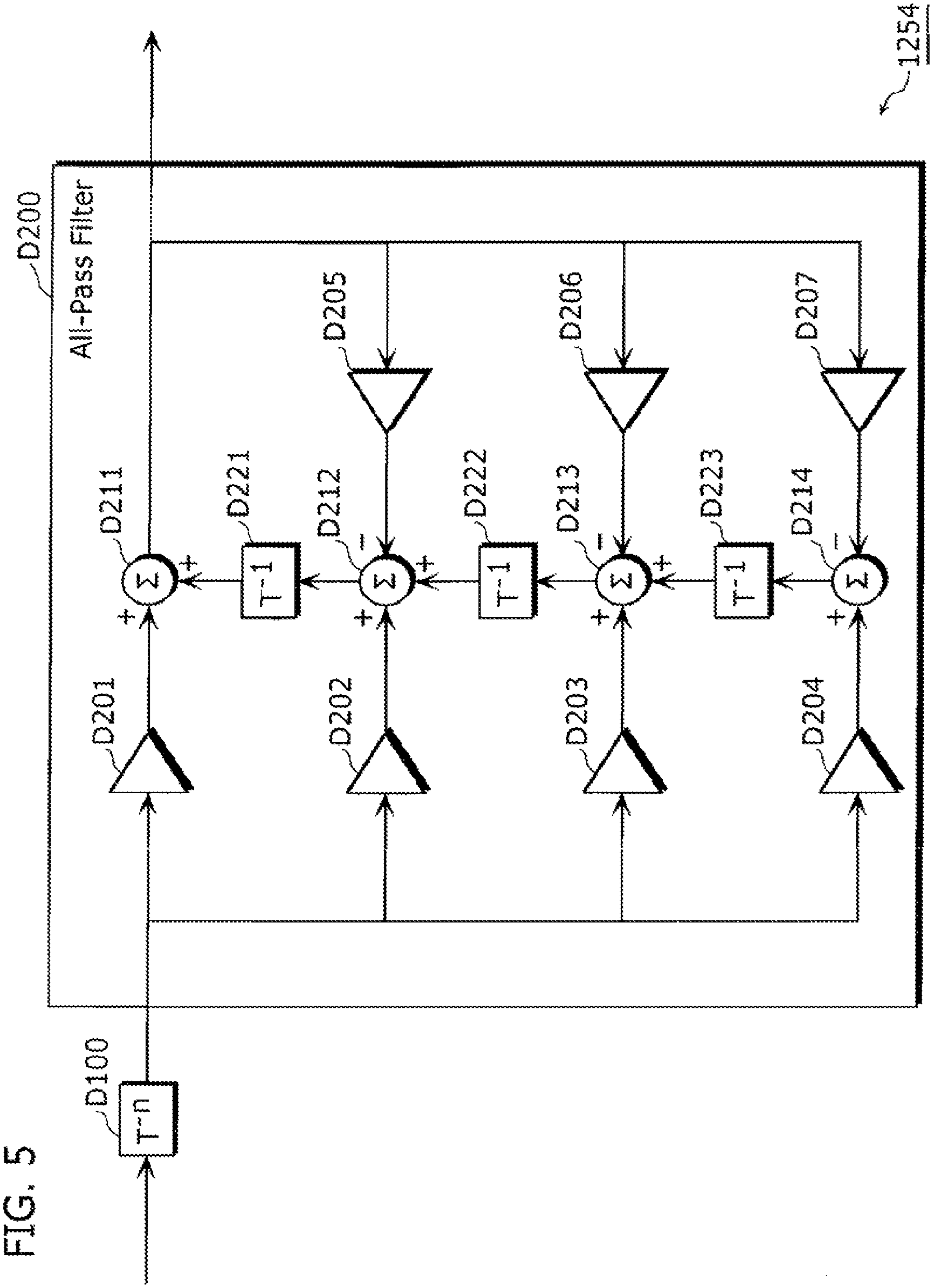
PRIOR ART FIG. 5
FIG. 5 is a block diagram showing a structure of the decorrelated signal generation unit of the conventional multi-channel acoustic signal processing device.
Figure 6:
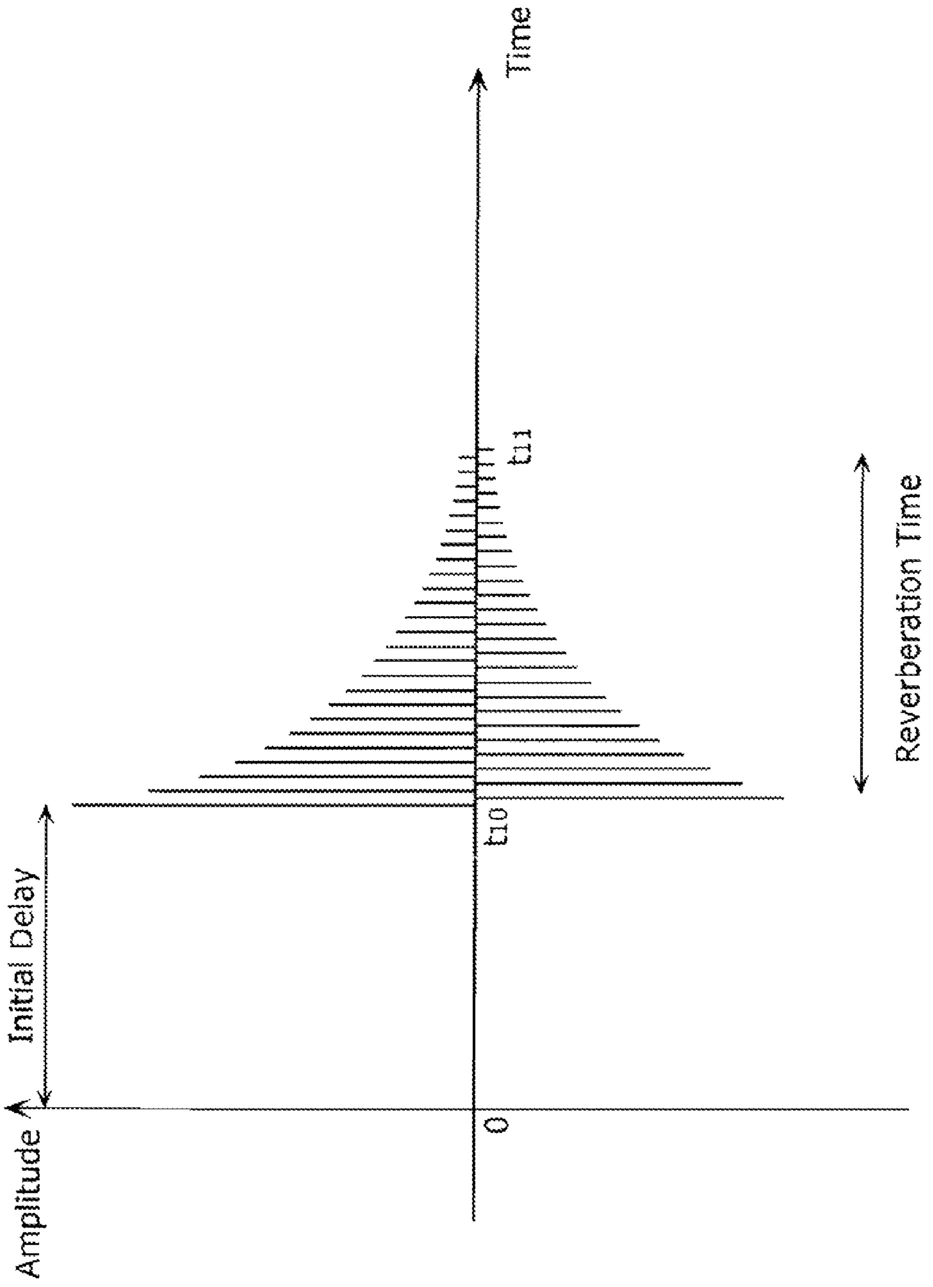
PRIOR ART FIG. 6
FIG. 6 is a graph showing an impulse response of the decorrelated signal generation unit of the conventional multi-channel acoustic signal processing device.
Figure 7:
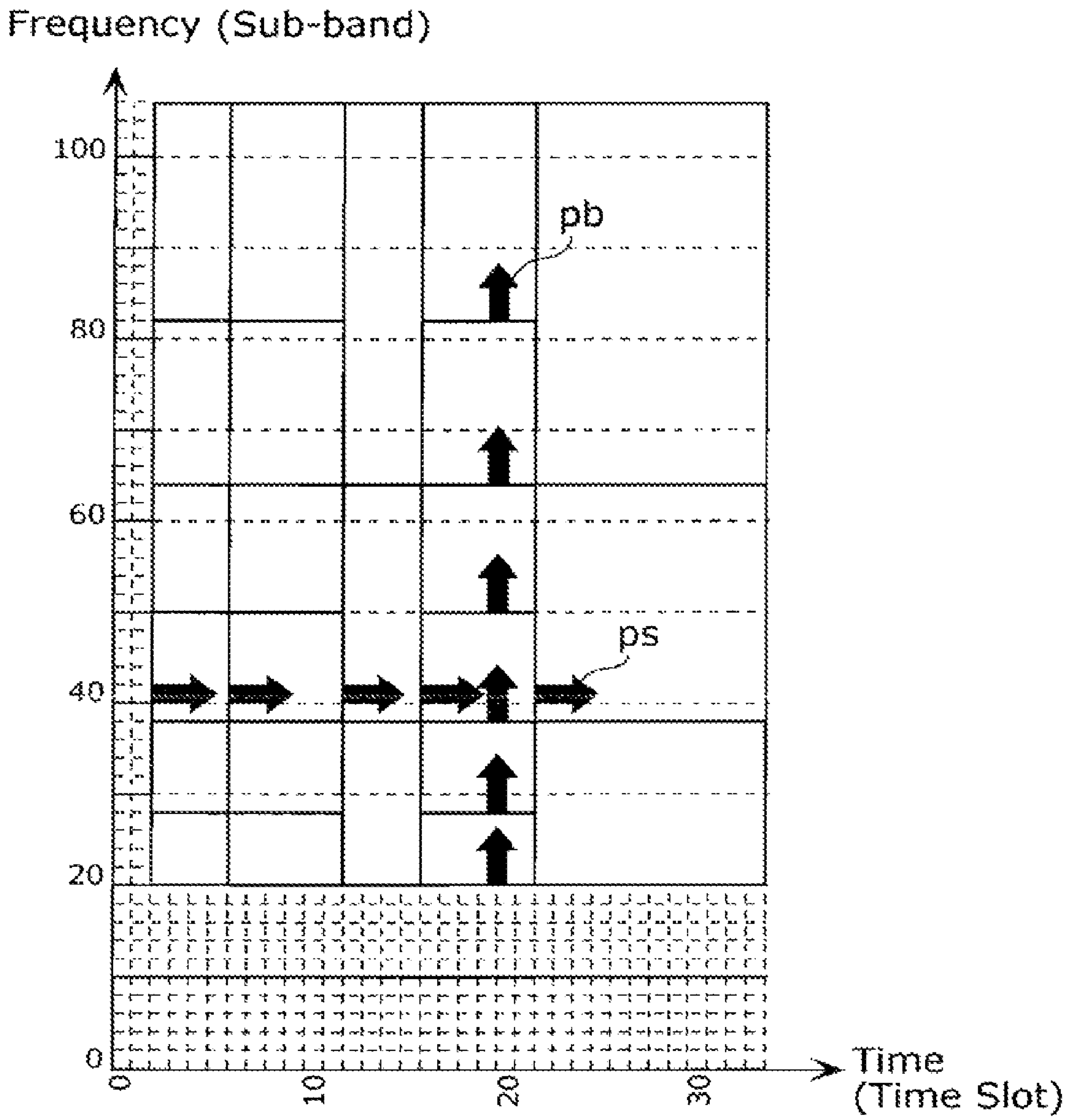
PRIOR ART FIG. 7
FIG. 7 is an explanatory diagram for explaining the down-mixed signal of the conventional multi-channel acoustic signal processing device.
Figure 8:
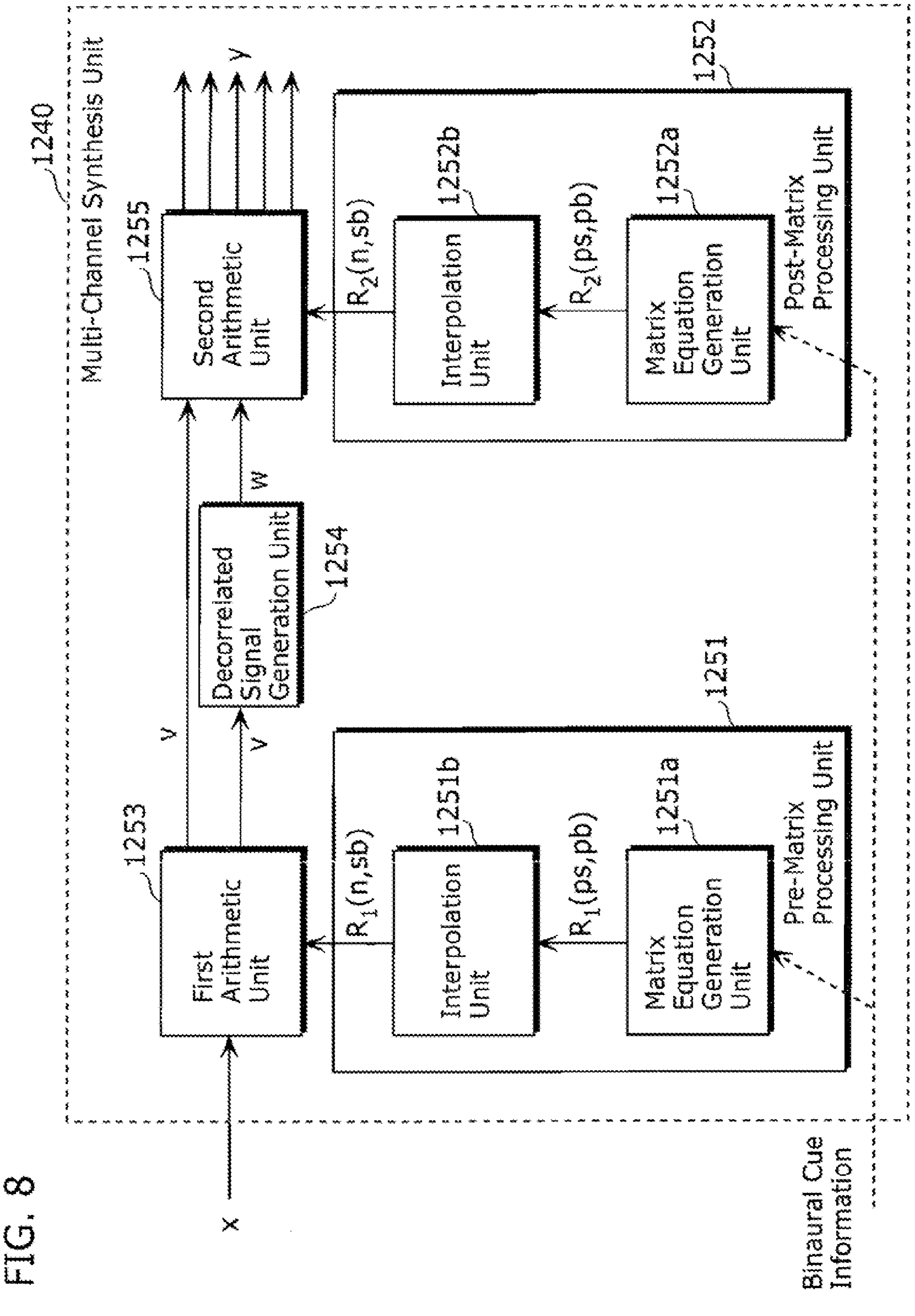
PRIOR ART FIG. 8
FIG. 8 is a block diagram showing detailed structures of the pre-matrix processing unit and the post-matrix processing unit of the conventional multi-channel acoustic signal processing device.

100 multi-channel acoustic signal processing device
**100*a*** multi-channel acoustic coding unit
**100*b*** multi-channel acoustic decoding unit
110 down-mix unit
120 binaural cue calculation unit
130 audio encoder unit
140 multiplexing unit
150 inverse-multiplexing unit
160 audio decoder unit
170 analysis filter unit
180 multi-channel synthesis unit
181 decorrelated signal generation unit
182 first arithmetic unit
183 second arithmetic unit
184 pre-matrix processing unit
185 post-matrix processing unit
186 third arithmetic unit
187 matrix processing unit
190 synthesis filter unit

DETAILED DESCRIPTION OF THE INVENTION

The following describes a multi-channel acoustic signal processing device according to a preferred embodiment of the present invention.

Figure 9:
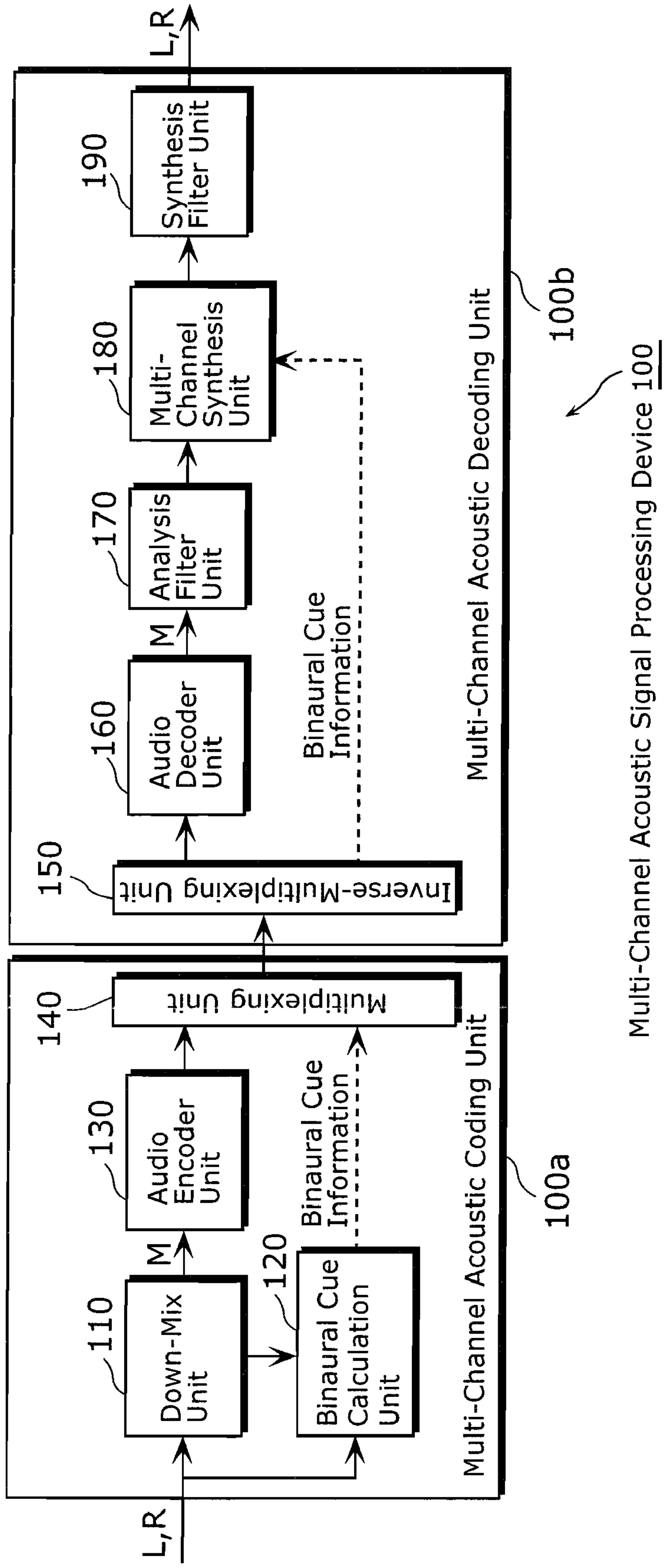
FIG. 9 is a block diagram showing a structure of a multi-channel acoustic signal processing device according to an embodiment of the present invention.

FIG. 9 is a block diagram showing a structure of the multi-channel acoustic signal processing device according to the embodiment of the present invention.

The multi-channel acoustic signal processing device 1000 according to the present embodiment reduces loads of arithmetic operations. The multi-channel acoustic signal processing device 1000 has: a multi-channel acoustic coding unit **100*a* which performs spatial acoustic coding on a group of audio signals and outputs the resulting acoustic coded signal; and a multi-channel acoustic decoding unit 100*b*** which decodes the acoustic coded signal.

The multi-channel acoustic coding unit **100*a* processes input signals (input signals L and R, for example) in units of frames which are indicated by 1024-samples, 2048-samples, or the like. The multi-channel acoustic coding unit 100*a* includes a down-mix unit 110, a binaural cue calculation unit 120, an audio encoder unit 130, and a multiplexing unit 140**.

The down-mix unit 110 generates a down-mixed signal M in which audio signals L and R of two channels that are expressed as spectrums are down-mixed, by calculating an average of the audio signals L and R of two channels that are expressed as spectrums, in other words, by calculating M=(L+R)/2.

The binaural cue calculation unit 120 generates binaural cue information by comparing the down-mixed signal M and the audio signals L and R for each spectrum band. The binaural cue information is used to reproduce the audio signals L and R from the down-mixed signal.

The binaural cue information indicates: inter-channel level/intensity difference (IID); inter-channel coherence/correlation (ICC); inter-channel phase/delay difference (IPD); and channel prediction coefficients (CPC).

In general, the inter-channel level/intensity difference (IID) is information for controlling balance and localization of audio, and the inter-channel coherence/correlation (ICC) is information for controlling width and diffusion of audio. Both of the information are spatial parameters to help listeners to imagine auditory scenes.

The audio signals L and R that are expressed as spectrums, and the down-mixed signal M are generally sectionalized into a plurality of groups each including "parameter bands". Therefore, the binaural cue information is calculated for each of the parameter bands. Note that hereinafter the "binaural cue information" and the "spatial parameter" are often used synonymously with each other.

The audio encoder unit 130 compresses and codes the down-mixed signal M, according to, for example, MPEG Audio Layer-3 (MP3), Advanced Audio Coding (AAC), or the like. The multiplexing unit 140 multiplexes the down-mixed signal M and the quantized binaural cue information to generate a bitstream, and outputs the bitstream as the above-mentioned acoustic coded signal.

The multi-channel acoustic decoding unit 100*b* includes an inverse-multiplexing unit 150, an audio decoder unit 160, an analysis filter unit 170, a multi-channel synthesis unit 180, and a synthesis filter unit 190.

The inverse-multiplexing unit 150 obtains the above-mentioned bitstream, divides the bitstream into the quantized binaural cue information and the coded down-mixed signal M, and outputs the resulting binaural cue information and down-mixed signal M. Note that the inverse-multiplexing unit 150 inversely quantizes the quantized binaural cue information, and outputs the resulting binaural cue information.

The audio decoder unit 160 decodes the coded down-mixed signal M to be outputted to the analysis filter unit 170.

The analysis filter unit 170 converts an expression format of the down-mixed signal M into a time/frequency hybrid expression to be outputted.

The multi-channel synthesis unit 180 obtains the down-mixed signal M from the analysis filter unit 170, and the binaural cue information from the inverse-multiplexing unit 150. Then, using the binaural cue information, the multi-channel synthesis unit 180 reproduces two audio signals L and R from the down-mixed signal M to be in a time/frequency hybrid expression.

The synthesis filter unit 190 converts the expression format of the reproduced audio signals from a time/frequency hybrid expression into a time expression, thereby outputting audio signals L and R in the time expression.

Although it has been described that the multi-channel acoustic signal processing device 100 according to the present embodiment codes and decodes audio signals of two channels as one example, the multi-channel acoustic signal processing device 100 according to the present embodiment is able to code and decode audio signals of more than two channels (audio signals of six channels forming 5.1-channel sound source, for example).

Here, the present embodiment is characterized in the multi-channel synthesis unit 180 of the multi-channel acoustic decoding unit 100*b*.

Figure 10:
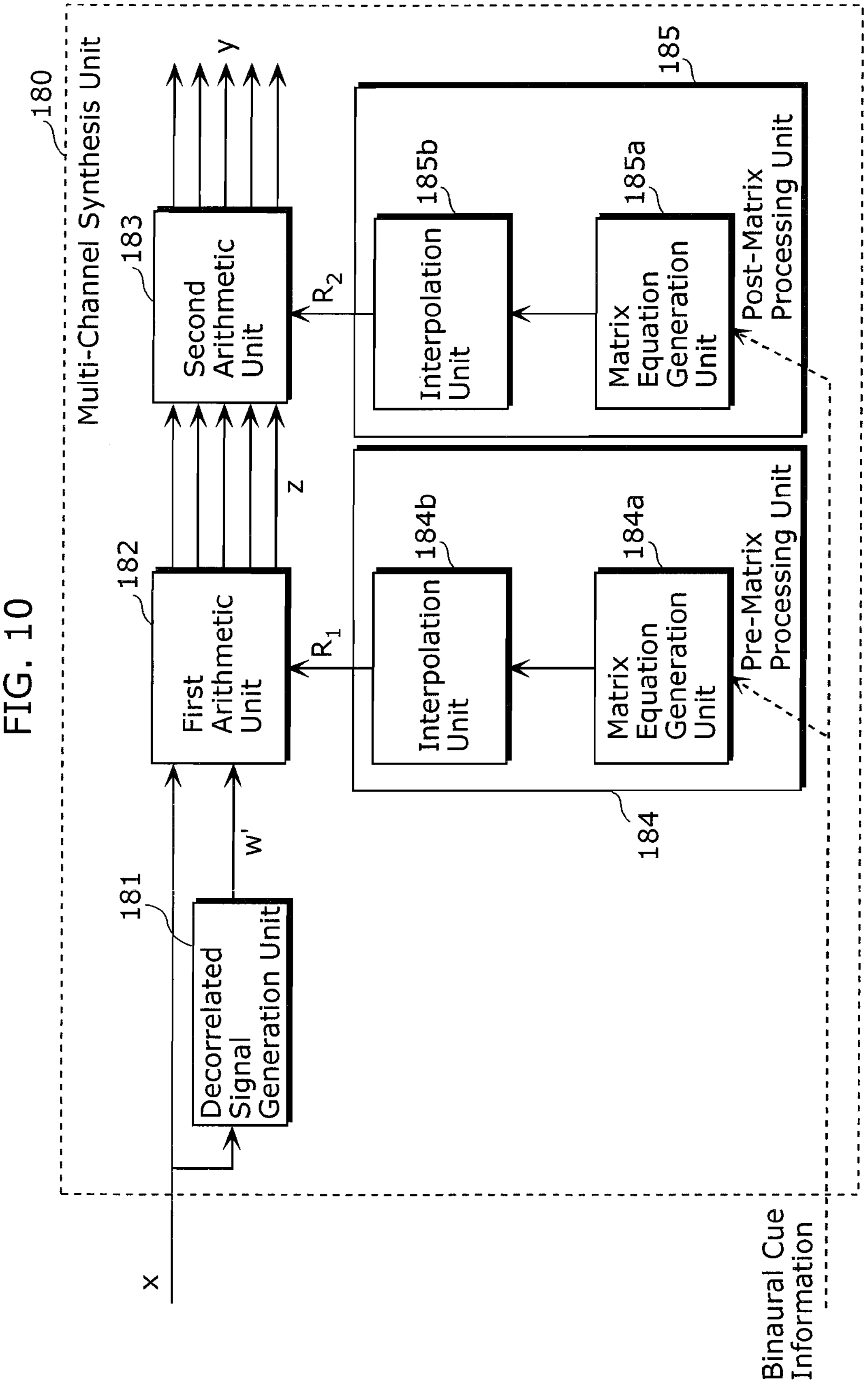
FIG. 10 is a block diagram showing a structure of a multi-channel synthesis unit according to the embodiment of the present invention.

FIG. 10 is a block diagram showing a structure of the multi-channel synthesis unit 180 according to the embodiment of the present invention.

The multi-channel synthesis unit 180 according to the present invention reduces loads of arithmetic operations. The multi-channel synthesis unit 180 has a decorrelated signal generation unit 181, a first arithmetic unit 182, a second arithmetic unit 183, a pre-matrix processing unit 184, and a post-matrix processing unit 185.

The decorrelated signal generation unit 181 is configured in the same manner as the above-described decorrelated signal generation unit 1254, including the all-pass filter D200 and the like. This decorrelated signal generation unit 181 obtains the down-mixed signal M expressed by time/frequency hybrid as an input signal x. Then, the decorrelated signal generation unit 181 performs reverberation processing on the input signal x, thereby generating and outputting a decorrelated signal w' that represents a sound which includes a sound represented by the input signal and reverberation. More specifically, assuming that a vector representing the input signal x is X=(M, M, M, M, M), the decorrelated signal generation unit 181 generates the decorrelated signal w' according to the following equation 7. Note that the decorrelated signal w' has low correlation with the input signal x.

$$w' = decorr(x) = \begin{bmatrix} M_{rev} \\ M_{rev} \\ M_{rev} \\ M_{rev} \\ M_{rev} \end{bmatrix} \quad \text{[Equation 7]}$$

The pre-matrix processing unit 184 includes a matrix equation generation unit 184*a* and an interpolation unit 184*b*. The pre-matrix processing unit 184 obtains the binaural cue information, and using the binaural cue information, generates a matrix $R_1$ which indicates distribution of signal intensity level for each channel.

Using the inter-channel level/intensity difference IID of the binaural cue information, the matrix equation generation unit 184*a* generates, for each band (ps, pb), the above-described matrix $R_1$ made up of vector elements $R_1[1]$ to $R_1[5]$. This means that the matrix $R_1$ is varied as time passes.

The interpolation unit 184*b* maps, in other words, interpolates, the matrix $R_1$ (ps, pb) for each band (ps, pb) according to (i) a frequency high resolution time index n and (ii) a sub-sub-band index sb of the input signal x of a hybrid expression. As a result, the interpolation unit 184*b* generates a matrix $R_1$ (n, sb) for each band (n, sb). As described above, the interpolation unit 184*b* ensures that transition of the matrix $R_1$ over a boundary of a plurality of bands is smooth.

The first arithmetic unit 182 multiplies a matrix of the decorrelation signal w' by the matrix $R_1$, thereby generating and outputting an intermediate signal z expressed by the following equation 8.

$$R_1 decorr(x) = \quad \text{[Equation 8]}$$

-continued $$\begin{bmatrix} R_1[1] & 0 & 0 & 0 & 0 \\ 0 & R_1[2] & 0 & 0 & 0 \\ 0 & 0 & R_1[3] & 0 & 0 \\ 0 & 0 & 0 & R_1[4] & 0 \\ 0 & 0 & 0 & 0 & R_1[5] \end{bmatrix} \begin{bmatrix} M_{rev} \\ M_{rev} \\ M_{rev} \\ M_{rev} \\ M_{rev} \end{bmatrix}$$

$$z = \begin{bmatrix} M \\ R_1 decorr(x) \end{bmatrix} = \begin{bmatrix} M \\ R_1[1]M_{rev} \\ R_1[2]M_{rev} \\ R_1[3]M_{rev} \\ R_1[4]M_{rev} \\ R_1[5]M_{rev} \end{bmatrix}$$

The post-matrix processing unit 185 includes a matrix equation generation unit 185*a* and an interpolation unit 185*b*. The post-matrix processing unit 185 obtains the binaural cue information, and using the binaural cue information, generates a matrix $R_2$ which indicates distribution of reverberation for each channel.

The post-matrix processing unit 185*a* derives a mixing coefficient $H_{ij}$ from the inter-channel coherence/correlation ICC of the binaural cue information, and then generates for each band (ps, pb) the above-described matrix $R_2$ including the mixing coefficient $H_{ij}$. This means that the matrix $R_2$ is varied as time passes.

The interpolation unit 185*b* maps, in other words, interpolates, the matrix $R_2$ (ps, pb) for each band (ps, pb) according to (i) a frequency high resolution time index n and (ii) a sub-sub-band index sb of the input signal x of a hybrid expression. As a result, the interpolation unit 185*b* generates a matrix $R_2$ (n, sb) for each band (n, sb). As described above, the interpolation unit 185*b* ensures that transition of the matrix $R_2$ over a boundary of a plurality of bands is smooth.

As expressed in the following equation 9, the second arithmetic unit 183 multiplies a matrix of the intermediate signal z by the matrix $R_2$, and outputs an output signal y which represents the result of the matrix operation. In other words, the second arithmetic unit 183 divides the intermediate signal z into six audio signals $L_f$, $R_f$, $L_s$, $R_s$, C, and LFE.

[Equation 9]

$$y = R_2 z = \begin{bmatrix} R_{2,LF} \\ R_{2,RF} \\ R_{2,LS} \\ R_{2,RS} \\ R_{2,C} \\ R_{2,LFE} \end{bmatrix} z = \begin{bmatrix} L_f \\ R_f \\ L_s \\ R_s \\ C \\ LFE \end{bmatrix}$$

As described above, according to the present embodiment, the decorrelated signal w' is generated for the input signal x, and a matrix operation using the matrix $R_1$ is performed on the decorrelated signal w'. In other words, although a matrix operation using the matrix $R_1$ is conventionally performed on the input signal x, and a decorrelated signal w is generated for an intermediate signal v which is the result of the arithmetic operation, the present embodiment performs the arithmetic operation in a reversed order of the conventional operation.

However, even if the order of the processing is reversed, it is known from experience that $R_1$decorr(x) of the equation 8 is substantially equal to decorr(v) that is decorr($R_1$x). In other words, the intermediate signal z, for which the matrix operation of the matrix $R_2$ in the second arithmetic unit 183 of the present embodiment is to be performed, is substantially equal to the decorrelated signal w, for which the matrix operation of the matrix $R_2$ of the conventional second arithmetic unit 1255 is to be performed.

Therefore, as described in the present embodiment, even if the order of the processing is reversed, the multi-channel synthesis unit 180 can output the same output signal y as the conventional output signal.

Figure 11:
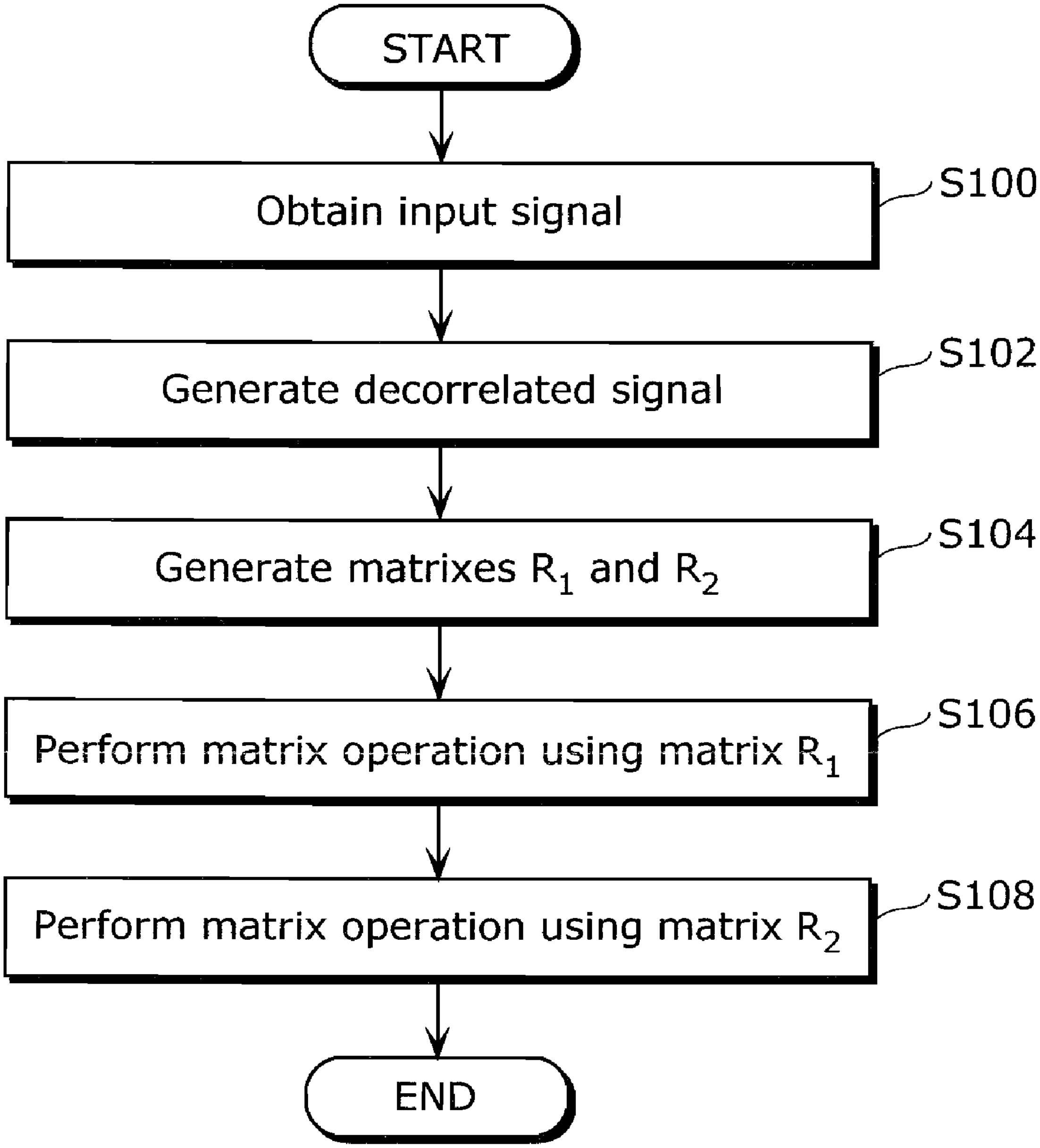
FIG. 11 is a flowchart of processing of the multi-channel synthesis unit according to the embodiment of the present invention.

FIG. 11 is a flowchart of the processing of the multi-channel synthesis unit 180 according to the present embodiment.

Firstly, the multi-channel synthesis unit 180 obtains an input signal x (Step S100), and generates a decorrelated signal w' for the input signal x (Step S102). In addition, the multi-channel synthesis unit 180 generates a matrix $R_1$ and a matrix $R_2$ based on the binaural cue information (Step S104).

Then, the multi-channel synthesis unit 180 generates an intermediate signal z, by multiplying (i) the matrix $R_1$ generated at Step S104 by (ii) a matrix indicated by the input signal x and the decorrelated signal w', in other words, by performing a matrix operation using the matrix $R_1$ (Step S106).

Furthermore, the multi-channel synthesis unit 180 generates an output signal y, by multiplying (i) the matrix $R_2$ generated at Step S104 by (ii) a matrix indicated by the intermediate signal z, in other words, by performing a matrix operation using the matrix $R_2$ (Step S106).

As described above, according to the present embodiment, the arithmetic operations using the matrix $R_1$ and the matrix $R_2$ indicating distribution of signal intensity level and distribution of reverberation, respectively, after the generation of the decorrelated signal. Thereby, it is possible to perform together both of (i) the arithmetic operation using the matrix $R_1$ indicating the distribution of signal intensity level from (ii) the arithmetic operation using the matrix $R_2$ indicating the distribution of reverberation, without separating these arithmetic operations before and after the generation of the decorrelated signal as the conventional manner. As a result, the arithmetic operation loads can be reduced.

Here, in the multi-channel synthesis unit 180 according to the present embodiment, the order of the processing is changed as previously explained, so that the structure of the multi-channel synthesis unit 180 of FIG. 10 can be further simplified.

Figure 12:
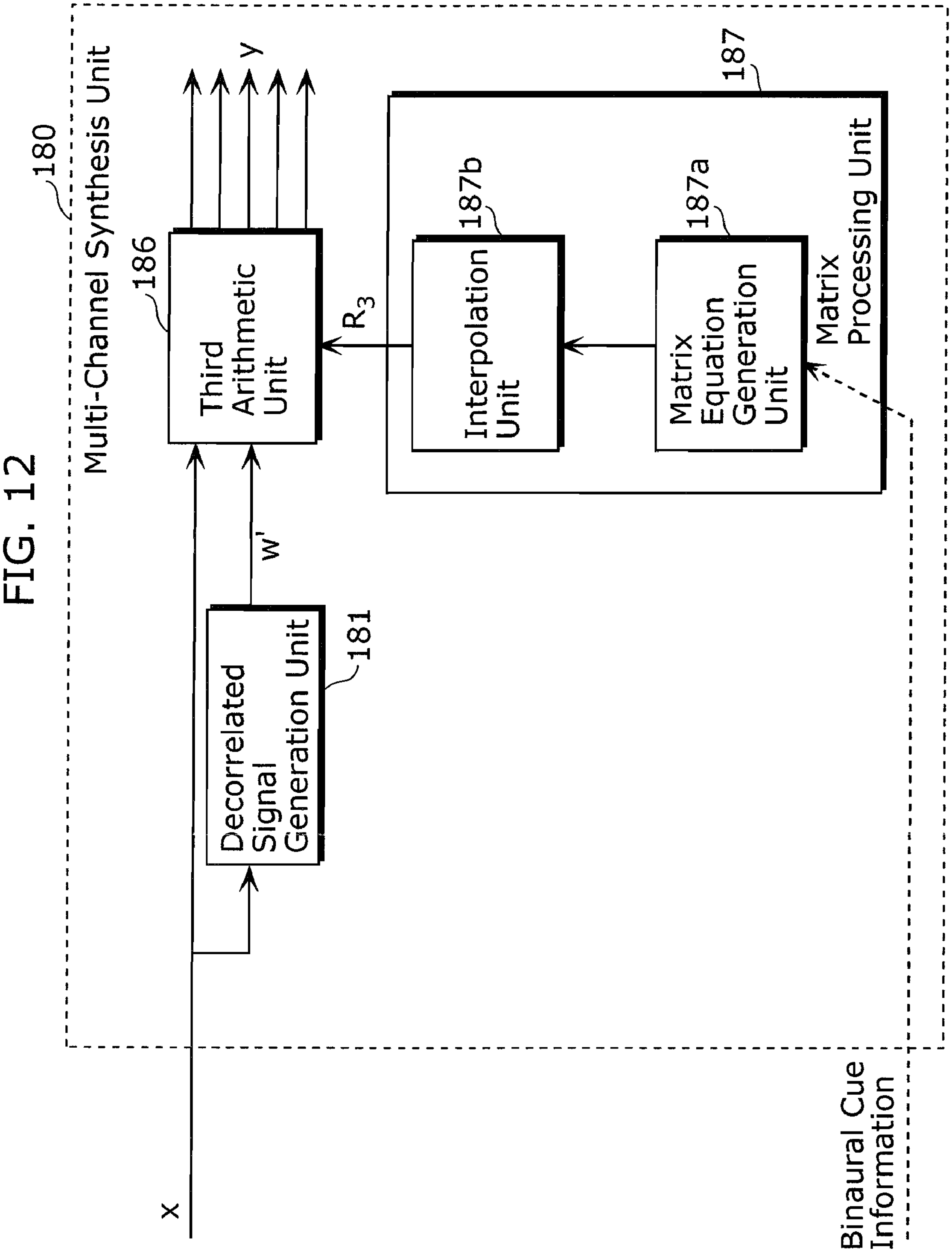
FIG. 12 is a block diagram showing a structure of a simplified multi-channel synthesis unit according to the embodiment of the present invention.

FIG. 12 is a block diagram showing a simplified structure of the multi-channel synthesis unit 180.

This multi-channel synthesis unit 180 has: a third arithmetic unit 186, instead of the first arithmetic unit 182 and the second arithmetic unit 183; and also a matrix processing unit 187, instead of the pre-matrix processing unit 184 and the post-matrix processing unit 185.

The matrix processing unit 187 is formed by combining the pre-matrix processing unit 184 and the post-matrix processing unit 185, and has a matrix equation generation unit 187*a* and an interpolation unit 187*b*.

Using the inter-channel level/intensity difference IID of the binaural cue information, the matrix equation generation unit 187*a* generates, for each band (ps, pb), the above-described matrix $R_1$ made up of vector elements $R_1[1]$ to $R_1[5]$. In addition, the post-matrix processing unit 187*a* derives a mixing coefficient $H_{ij}$ from the inter-channel coherence/correlation ICC of the binaural cue information, and then generates for each band (ps, pb) the above-described matrix $R_2$ including the mixing coefficient $H_{ij}$.

Furthermore, the matrix equation generation unit 187*a* multiplies the above-generated matrix $R_1$ by the above-generated matrix $R_2$, thereby generating for each band (ps, pb) a matrix R3 which is the calculation result, as an integrated matrix.

The interpolation unit 187*b* maps, in other words, interpolates, the matrix $R_3$ (ps, pb) for each band (ps, pb) according to (i) a frequency high resolution time index n and (ii) a sub-sub-band index sb of the input signal x of a hybrid expression. As a result, the interpolation unit 187*b* generates a matrix $R_3$ (n, sb) for each band (n, sb). As described above, the interpolation unit 187*b* ensures that transition of the matrix $R_3$ over a boundary of a plurality of bands is smooth.

The third arithmetic unit 186 multiplies a matrix indicated by the decorrelated signal w' and the input signal x by the matrix $R_3$, thereby outputting an output signal y indicating the result of the multiplication.

[Equation 10]

$$y = R_3\begin{bmatrix} M \\ decorr(x) \end{bmatrix} = \begin{bmatrix} R_{3,LF} \\ R_{3,RF} \\ R_{3,LS} \\ R_{3,RS} \\ R_{3,C} \\ R_{3,LFE} \end{bmatrix}\begin{bmatrix} M \\ M_{rev} \\ M_{rev} \\ M_{rev} \\ M_{rev} \\ M_{rev} \end{bmatrix} = \begin{bmatrix} L_f \\ R_f \\ L_s \\ R_s \\ C \\ LFE \end{bmatrix}$$

As described above, in the present embodiment, the number of interpolating (the number of interpolations) becomes about a half of the number of interpolating (the number of interpolations) of the conventional interpolation units 1251*b* and 1252*b*, and the number of multiplication (the number of matrix operations) of the third arithmetic unit 186 becomes about a half of the number of multiplications (the number of matrix operations) of the conventional first arithmetic unit 1253 and the second arithmetic unit 1255. This means that, in the present embodiment, only a single matrix operation using the matrix R3 can divide the input signal x into audio signals of a plurality of channels. On the other hand, in the present embodiment, the processing of the matrix equation generation unit 187*a* is slightly increased. However, the band resolution (ps, pb) of the binaural cue information of the matrix equation generation unit 187*a* is coarser than the band resolution (n, sb) of the interpolation unit 187*b* and the third arithmetic unit 186. Therefore, the arithmetic operation loads on the matrix equation generation unit 187*a* is smaller than the loads on the interpolation unit 187*b* and the third arithmetic unit 186, and its percentage of total is small. Thus, it is possible to significantly reduce arithmetic operation loads on the entire multi-channel synthesis unit 180 and the entire multi-channel acoustic signal processing device 100.

Figure 13:
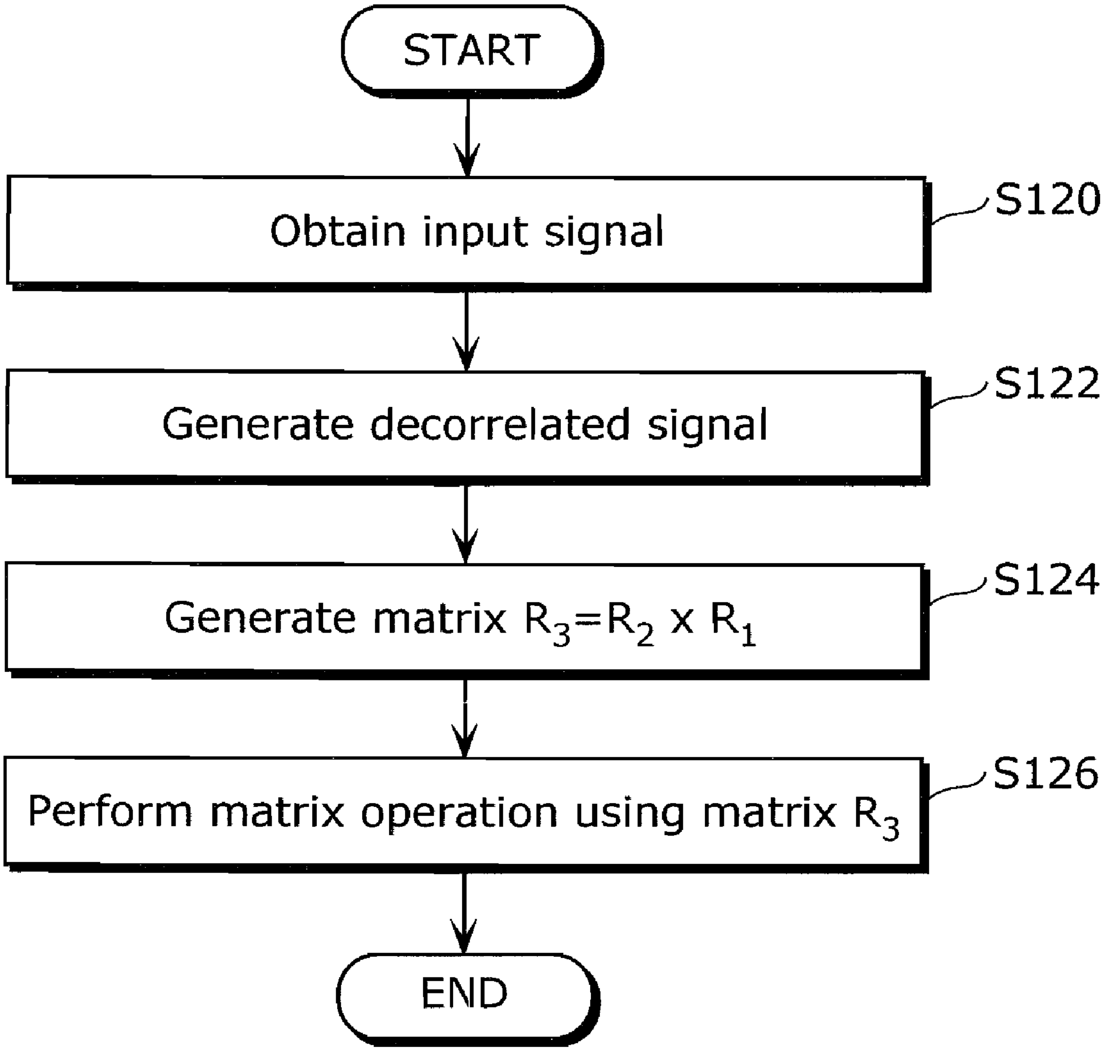
FIG. 13 is a flowchart of processing of the simplified multi-channel synthesis unit according to the embodiment of the present invention.

FIG. 13 is a flowchart of the processing of the simplified multi-channel synthesis unit 180.

Firstly, the multi-channel synthesis unit 180 obtains an input signal x (Step S120), and generates a decorrelated signal w' for the input signal x (Step S120). In addition, based on the binaural cue information, the multi-channel synthesis unit 180 generates a matrix $R_3$ indicating multiplication of the matrix $R_1$ by the matrix $R_2$ (Step S124).

Then, the multi-channel synthesis unit 180 generates an output signal y, by multiplying (i) the matrix $R_3$ generated at Step S124 by (ii) a matrix indicated by the input signal x and the decorrelated signal w', in other words, by performing a matrix operation using the matrix $R_3$ (Step S126).

(Modification 1)

Here, the first modification of the present embodiment is described.

In the multi-channel synthesis unit 180 of the present embodiment, the decorrelated signal generation unit 181 delays outputting of the decorrelated signal w' from the input signal x, so that, in the third arithmetic unit 186, time deviation occurs among the input signal x to be calculated, the decorrelated signal w', and the matrix $R_1$ included in the matrix $R_3$, which causes failure of synchronization among them. Note that the delay of the decorrelated signal w' always occurs with the generation of the decorrelated signal w'. In the conventional technologies, on the other hand, in the first arithmetic unit 1253 there is no such time deviation between the input signal x to be calculated and the matrix $R_1$.

Therefore, the multi-channel synthesis unit 180 according to the present embodiment, there is a possibility of failing to output the ideal proper output signal y.

Figure 14:
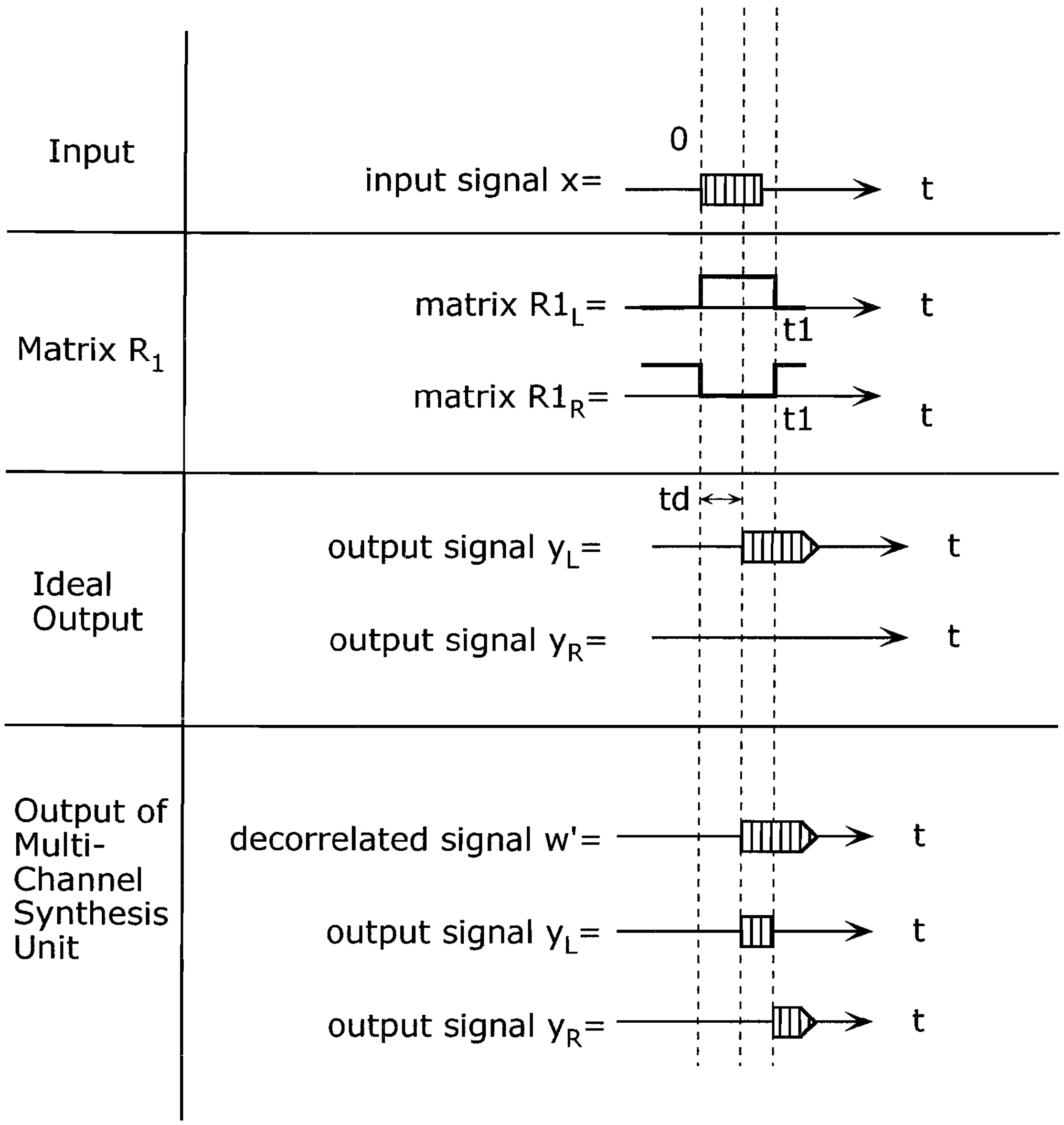
FIG. 14 is an explanatory diagram for explaining signals outputted from the multi-channel synthesis unit according to the embodiment of the present invention.

FIG. 14 is an explanatory diagram for explaining a signal outputted from the multi-channel synthesis unit 180 according to the above-described embodiment.

For example, the input signal x is, as shown in FIG. 14, outputted at a timing t=0. Further, the matrix $R_1$ included in the matrix $R_3$ includes a matrix $R1_L$ which is a component for an audio signal L and a matrix $R1_R$ which is a component for an audio signal R. For example, the matrix $R1_L$ and the matrix $R1_R$ are set based on the binaural cue information, so that, as shown in FIG. 14, prior to the timing t=0 a higher level is distributed to the audio signal R, during a time=0 to t1 a higher level is distributed to the audio signal L, and after the timing t=t1 a higher level is distributed to the audio signal R.

Here, in the conventional multi-channel synthesis unit 1240, the input signal x is synchronized with the above-described matrix $R_1$. Therefore, when the intermediate signal v is generated from the input signal x according to the matrix $R1_L$ and the matrix $R1_R$, the intermediate signal v is generated so that the level is greatly bias to the audio signal L. Then, a decorrelated signal w is generated for the intermediate signal v. As a result, an output signal $y_L$ with reverberation is outputted as an audio signal L, being delayed by merely a delay time period td of the decorrelated signal w of the decorrelated signal generation unit 1254, but an output signal $y_R$ which is an audio signal R is not outputted. Such output signals $y_L$ and $y_R$ are considered as an example of ideal output.

On the other hand, the multi-channel synthesis unit 180 according to the above-described embodiment, the decorrelated signal w' with reverberation is firstly outputted being delayed by a delay time period td from the input signal x. Here, the matrix $R_3$ treated by the third arithmetic unit 186 includes the above-described matrix $R_1$ (matrix $R1_L$ and matrix $R1_R$). Therefore, if the matrix operation using the matrix $R_3$ is performed on the input signal x and the decorrelated signal w', there is no synchronization among the input signal x, the decorrelated signal w', and the matrix $R_1$, so that the output signal $y_L$ which is the audio signal L is outputted only during a time t=td to t1, and the output signal $y_R$ which is the audio signal R is outputted after the timing t=t1.

As explained above, the multi-channel synthesis unit 180 outputs the output signal $y_R$ as well as the output signal $y_L$, although the signal to be outputted is only the output signal $y_L$. That is, the channel separation is deteriorated.

In order to address the above problem, the multi-channel synthesis unit according to the first modification of the present embodiment has a phase adjustment unit which adjusts a phase of the input signal x according to the decorrelated signal w' and the matrix $R_3$, thereby delaying outputting of the matrix $R_3$ from the matrix equation generation unit 187*d*.

Figure 15:
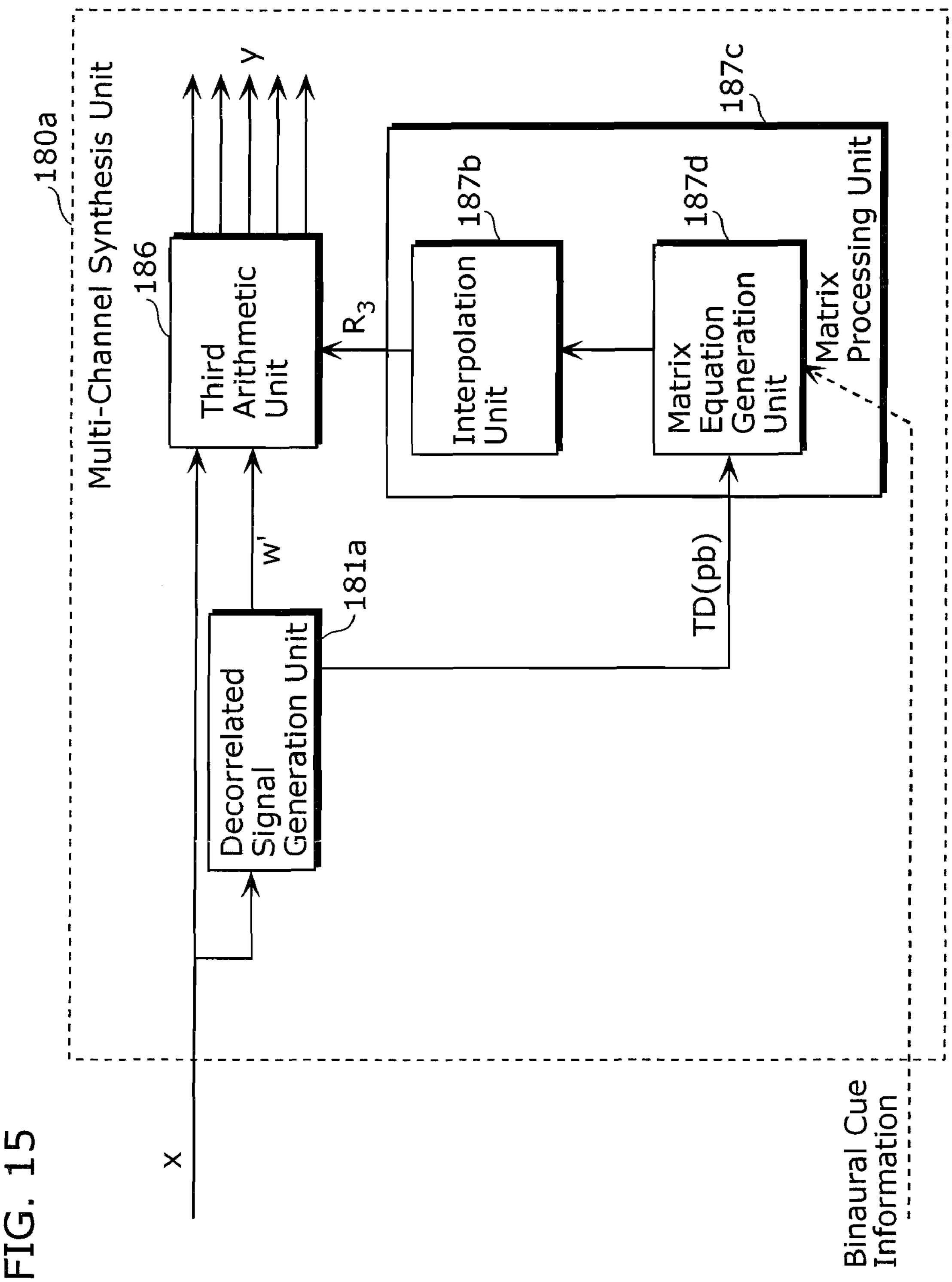
FIG. 15 is a block diagram showing a structure of a multi-channel synthesis unit according to a first modification of the embodiment.

FIG. 15 is a block diagram showing a structure of the multi-channel synthesis unit according to the first modification of the present embodiment.

The multi-channel synthesis unit 180*a* according to the first modification includes a decorrelated signal generation unit 181*a*, a third arithmetic unit 186, and a matrix processing unit 187*c*.

The decorrelated signal generation unit 181*a* has the same functions as the previously-described decorrelated signal generation unit, and has a further function of notifying the matrix processing unit 187*c* of a delay amount TD (pb) of a parameter band pb of the decorrelated signal w'. For example, the delay amount TD (pb) is equal to the delay time period td of the decorrelated signal w' from the input signal x.

The matrix processing unit 187*c* has a matrix equation generation unit 187*d* and an interpolation unit 187*b*. The matrix equation generation unit 187 has the same functions as the previously-described matrix equation generation unit 187*a*, and further has the above-described phase adjustment unit. The matrix equation generation unit 187 generates a matrix $R_3$ depending on the delay amount TD (pb) notified by the decorrelated signal generation unit 181*a*. In other words, the matrix equation generation unit 187*d* generates the matrix $R_3$ as expressed by the following equation 11.

$$R_3(ps,pb)=R_2(ps,pb)R_1(ps-TD(pb),pb) \quad \text{[Equation 1]}$$

Figure 16:
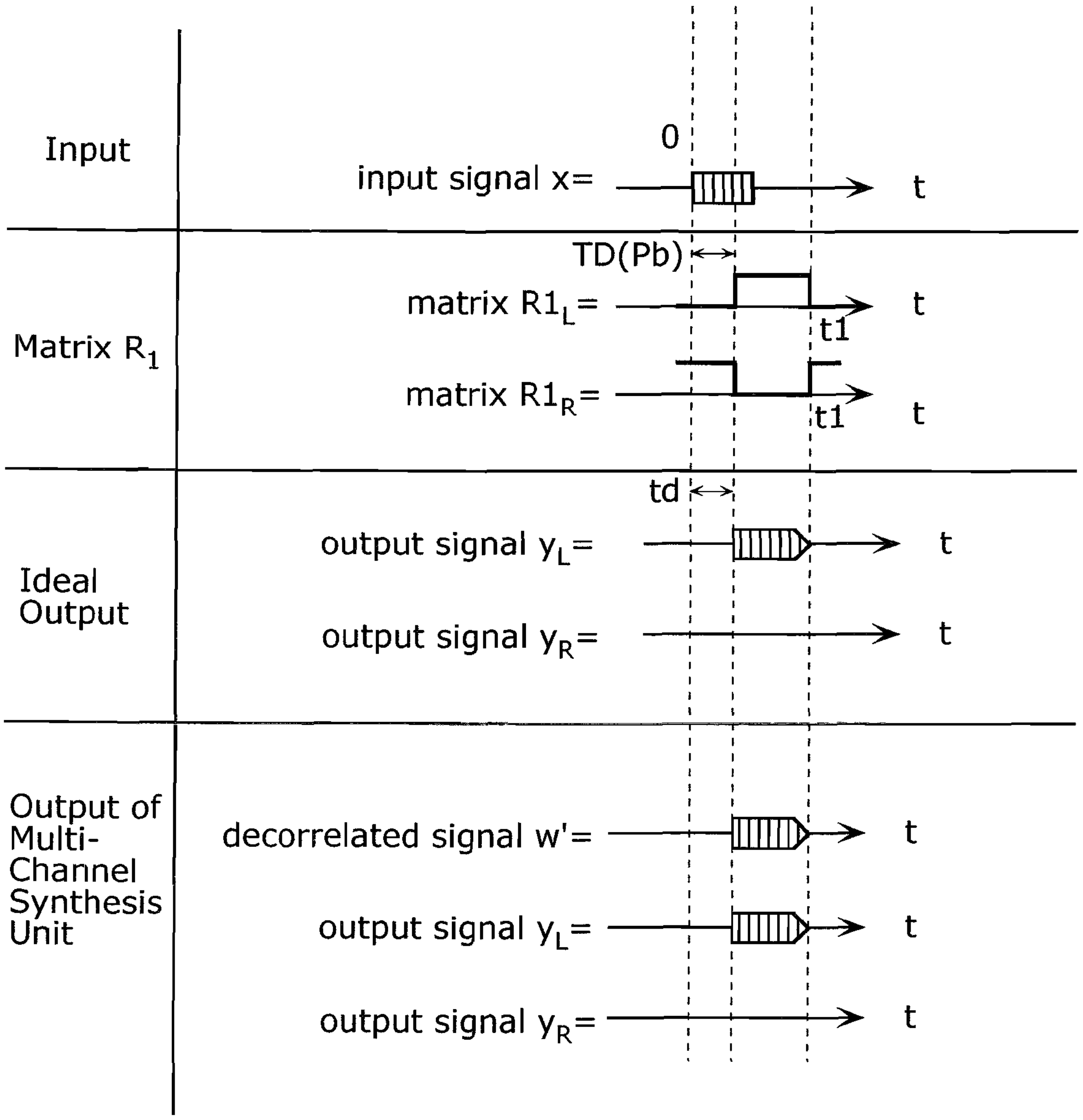
FIG. 16 is an explanatory diagram for explaining signals outputted from the multi-channel synthesis unit according to the first modification of the embodiment.

FIG. 16 is an explanatory diagram for explaining a signal outputted from the multi-channel synthesis unit 180*a* according to the first modification.

The matrix $R_1$ (matrix $R1_L$ and matrix $R1_R$) included in the matrix $R_3$ is generated by the matrix equation generation unit 187*d* being delayed by the delay amount TD (pb) from the parameter band pb of the input signal x.

As a result, even if the decorrelated signal w' is outputted being delayed from the input signal x by the delay time period td, the matrix $R_1$ (matrix $R1_L$ and matrix $R1_R$) included in the matrix $R_3$ is also delayed by the delay amount TD (pb). Therefore, it is possible to prevent such time deviation among the matrix $R_1$, the input signal x, and the decorrelated signal w', thereby achieving synchronization among them. As a result, the third arithmetic unit 186 of the multi-channel synthesis unit 180*a* outputs only the output signal $y_L$ from the timing t=td, and does not output the output signal $y_R$. In other words, the third arithmetic unit 186 can output ideal output signals $y_L$ and $y_R$. Therefore, in the first modification, the deterioration of the channel separation can be suppressed.

Note that it has been described in the first modification that the delay time period td=the delay amount TD (pb), but this may be changed. Note also that the matrix equation generation unit 187*d* generates the matrix R3 for each predetermined processing unit (band (ps, pb), for example), so that the delay amount TD (pb) may be a time period which is the closest to the delay time period td, and required for processing an integral multiple of a predetermined processed unit.

Figure 17:
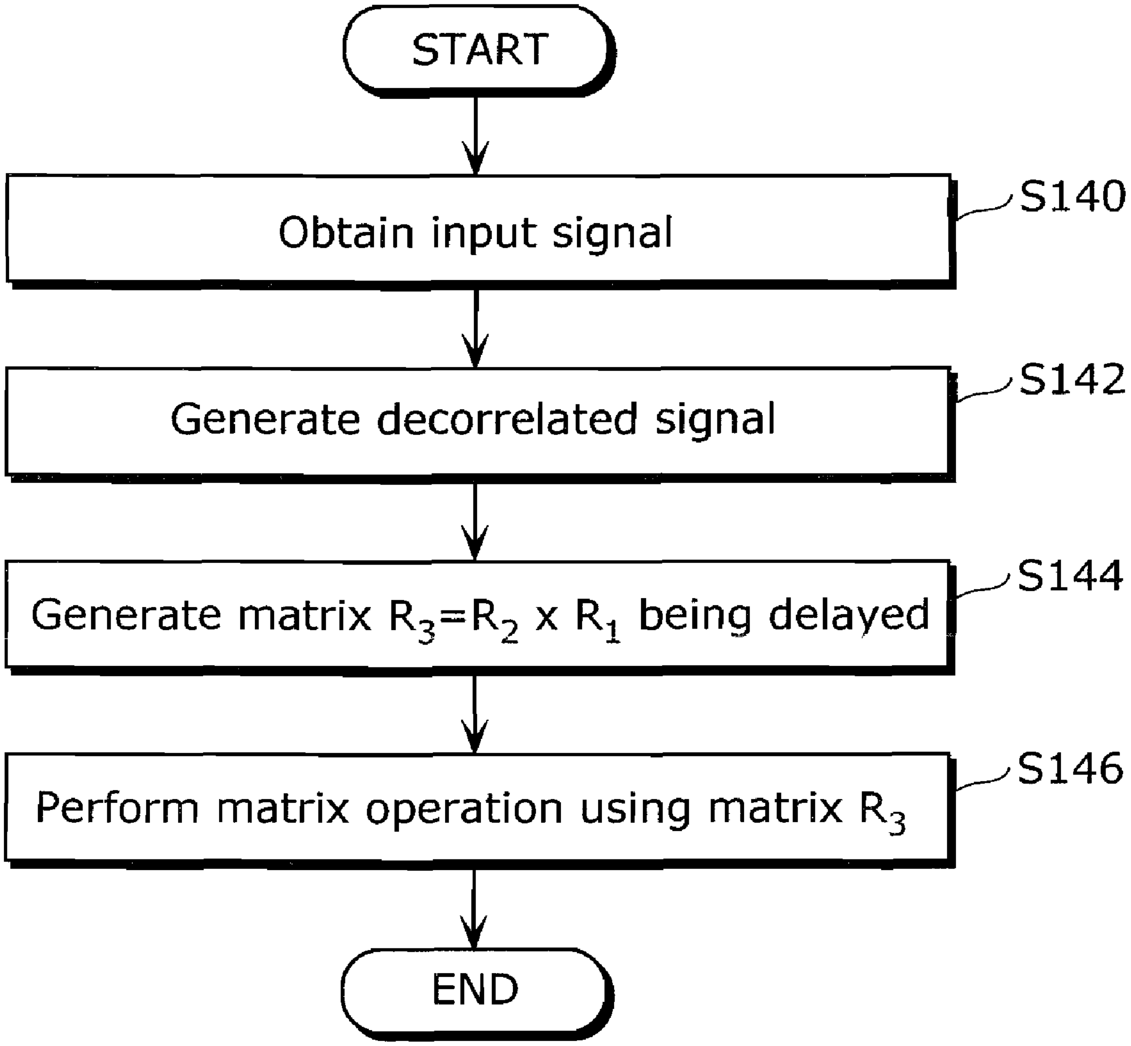
FIG. 17 is a flowchart of processing of the multi-channel synthesis unit according to the first modification of the embodiment.

FIG. 17 is a flowchart of processing of the multi-channel synthesis unit 180*a* according to the first modification.

Firstly, the multi-channel synthesis unit 180*a* obtains an input signal x (Step S140), and generates a decorrelated signal w' for the input signal x (Step S142). In addition, based on the binaural cue information, the multi-channel synthesis unit 180*a* generates a matrix $R_3$ indicating multiplication of a matrix $R_1$ by a matrix $R_2$, being delayed by a delay amount TD (pb) (Step S144). In other words, the multi-channel synthesis unit 180*a* delays the matrix $R_1$ included in the matrix $R_3$ by the delay amount TD (pb), using the phase adjustment unit.

Then, the multi-channel synthesis unit 180*a* generates an output signal y, by multiplying (i) the matrix $R_3$ generated at Step S144 by (ii) a matrix indicated by the input signal x and the decorrelated signal w', in other words, by performing a matrix operation using the matrix $R_3$ (Step S146).

Accordingly, in the first modification, the phase of the input signal x is adjusted by delaying the matrix $R_1$ included in the matrix $R_3$, which makes it possible to perform arithmetic operation on the decorrelated signal w' and the input signal x using an appropriate matrix $R_3$, thereby appropriately outputting the output signal y.

(Second Modification)

Here, the second modification of the present embodiment is described.

In the same manner as the multi-channel synthesis unit according to the above-described first modification, the multi-channel synthesis unit according to the second modification has the phase adjustment unit which adjusts the phase of the input signal x according to the decorrelated signal w' and the matrix $R_3$. The phase adjustment unit according to the second modification delays to input the input signal x to the third arithmetic unit 186. Therefore, in the second modification as well as the above case, the deterioration of the channel separation can be also suppressed.

Figure 18:
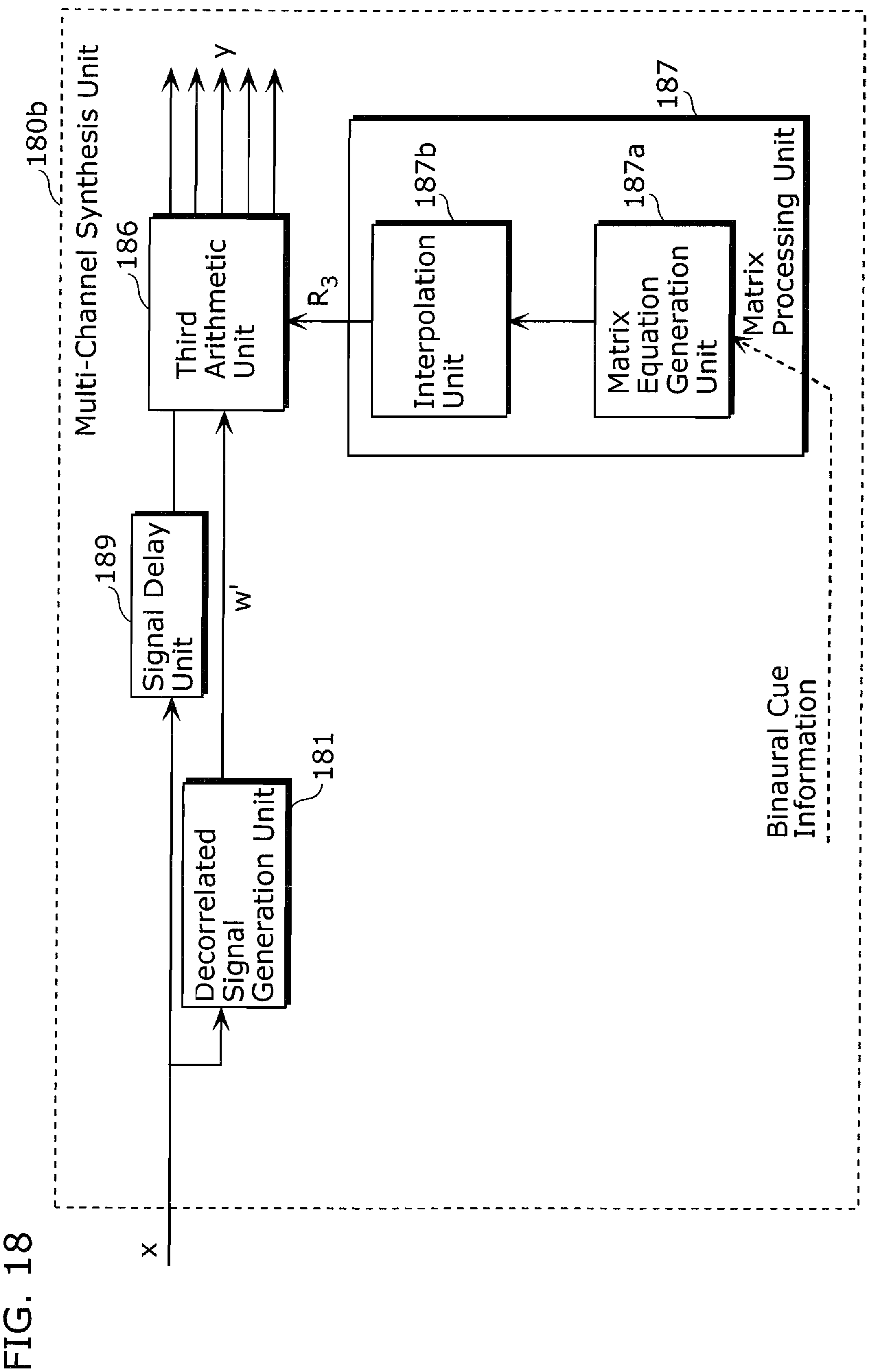
FIG. 18 is a block diagram showing a structure of a multi-channel synthesis unit according to a second modification of the embodiment.

FIG. 18 is a block diagram showing a structure of the multi-channel synthesis unit according to the second modification.

The multi-channel synthesis unit 180*b* according to the second modification has a signal delay unit 189 which is the phase adjustment means for delaying to input the input signal x to the third arithmetic unit 186. For example, the signal delay unit 189 delays the input signal x by a delay time period td of the decorrelated signal generation unit 181.

Thereby, in the second modification, even if output of the decorrelated signal w' is delayed from the input signal x by the delay time period td, input of the input signal x to the third delay unit 186 is delayed by the delay time period td, so that it is possible to eliminate the time deviation among the input signal x, the decorrelated signal w', and the matrix $R_1$ included in the matrix $R_3$ and thereby achieve synchronization among them. As a result, as shown in FIG. 16, the third arithmetic unit 186 of the multi-channel synthesis unit 180*a* outputs only the output signal $y_L$ from the timing t=td, and does not output the output signal YR. In other words, the third arithmetic unit 186 can output ideal output signals $y_L$ and $y_R$. Therefore, the deterioration of the channel separation can be suppressed.

Note that it has been described in the second modification that the delay time period td=the delay amount TD (pb), but this may be changed. Note also that, if the signal delay unit 189 performs the delay processing on each predetermined processing unit (band (ps, pb), for example), the delay amount TD (pb) may be a time period which is the closest to the delay time period td, and required for processing an integral multiple of a predetermined processed unit.

Figure 19:
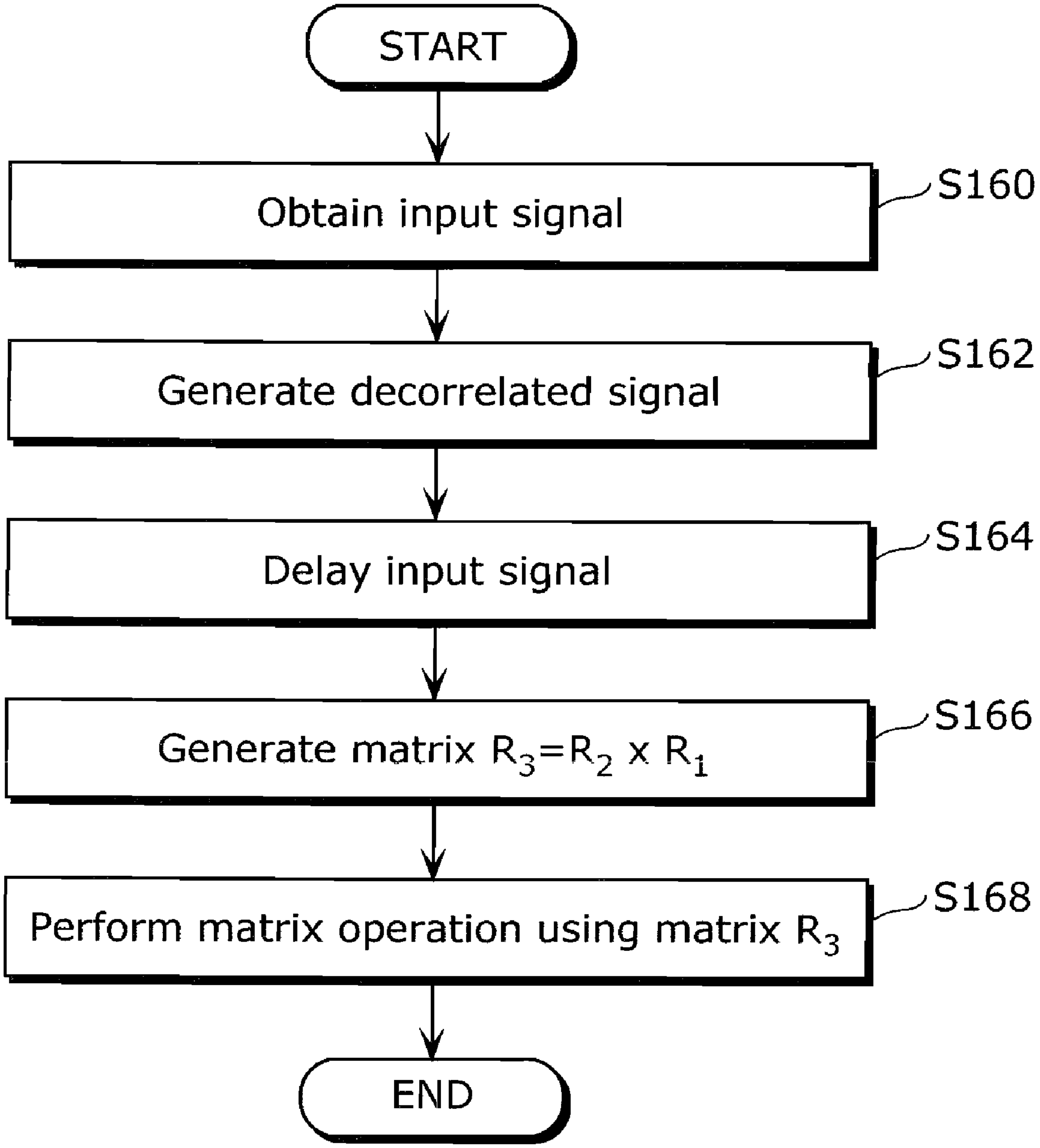
FIG. 19 is a flowchart of processing of the multi-channel synthesis unit according to the second modification of the embodiment.

FIG. 19 is a flowchart of processing of the multi-channel synthesis unit 180*b* according to the second modification.

Firstly, the multi-channel synthesis unit 180*b* obtains an input signal x (Step S160), and generates a decorrelated signal w' for the input signal x (Step S162). Then, the multi-channel synthesis unit 180*b* delays the input signal x (Step S164).

Further, the multi-channel synthesis unit 180*b* generates a matrix $R_3$ indicating multiplication of the matrix $R_1$ by the matrix $R_2$, based on the binaural cue information (Step S166).

Then, the multi-channel synthesis unit 180*b* generates an output signal y, by multiplying (i) the matrix $R_3$ generated at Step S166 by (ii) a matrix indicated by the input signal x and the decorrelated signal w', in other words, by performing a matrix operation using the matrix $R_3$ (Step S168).

Accordingly, in the second modification, the phase of the input signal x is adjusted by delaying the input signal x, which makes it possible to perform arithmetic operation on the decorrelated signal w' and the input signal x using an appropriate matrix $R_3$, thereby appropriately outputting the output signal y.

The above have been described the multi-channel acoustic signal processing device according to the present invention using the embodiment and their modifications, but the present invention is not limited to them.

For example, the phase adjustment unit in the first and second modification may perform the phase adjustment only when pre-echo occurs more than a predetermined detection limit.

That is, in the above-described first modification the phase adjustment unit 187*d* in the matrix equation generation unit 187*d* delays the matrix $R_3$, and in the above-described second modification the signal delay unit 189 which is the phase adjustment unit delays the input signal x. However, these phase delay means may perform the delay only when pre-echo occurs more than a predetermined detection limit. This pre-echo is noise caused immediately prior to impact sound, and occurs more according to the delay time period td of the decorrelated signal w'. Thereby, detection of the pre-echo can be surely prevented.

Note that the multi-channel acoustic signal processing device 100, the multi-channel acoustic coding unit 100*a*, the multi-channel acoustic decoding unit 100*b*, the multi-channel synthesis units 180, 180*a*, and 180*b*, or each unit included in the device and units may be implement as an integrated circuit such as a Large Scale Integration (LSI). Note also that the present invention may be realized as a computer program which causes a computer to execute the processing performed by the device and the units.

INDUSTRIAL APPLICABILITY

With the advantages of reducing loads of arithmetic operations, the multi-channel acoustic signal processing device according to present invention can be applied, for example, for home-theater systems, in-vehicle acoustic systems, computer game systems, and the like, and is especially useful for application for low bit-rate of broadcast and the like.

The invention claimed is:

1. A multi-channel acoustic signal processing device which divides an input signal into audio signals of m channels, where m is larger than 1, the input signal being generated by down-mixing the audio signals, said device comprising:

a decorrelated signal generation unit operable to generate a decorrelated signal by performing reverberation processing on the input signal, the decorrelated signal representing a sound represented by the input signal and reverberation;

a matrix operation unit operable to generate the audio signals of the m channels by performing an arithmetic operation on the input signal and the decorrelated signal generated by said decorrelated signal generation unit, the arithmetic operation using a matrix which indicates distribution of a signal intensity level and a distribution of the reverberation wherein said matrix operation unit includes:

a matrix generation unit operable to generate an integrated matrix which indicates multiplication of a level distribution matrix by a reverberation adjustment matrix, the level distribution matrix indicating the distribution of the signal intensity level and the reverberation adjustment matrix indicating the distribution of the reverberation; and an arithmetic unit operable to generate the audio signals of the m channels by multiplying (i) a matrix indicated by the decorrelated signal and the input signal by (ii) the integrated matrix generated by said matrix generation unit, and wherein said multi-channel acoustic signal processing device further comprises a phase adjustment unit operable to adjust a phase of the input signal according to the decorrelated signal and the integrated matrix.

2. The multi-channel acoustic signal processing device according to claim 1, wherein said phase adjustment unit is operable to delay one of the integrated matrix and the input signal which vary as time passes.

3. The multi-channel acoustic signal processing device according to claim 2, wherein said phase adjustment unit is operable to delay one of the integrated matrix and the input signal by a delay time period of the decorrelated signal generated by said decorrelated signal generation unit.

4. The multi-channel acoustic signal processing device according to claim 2, wherein said phase adjustment unit is operable to delay one of the integrated matrix and the input signal by a time period which is closest to a delay time period of the decorrelated signal generated by said decorrelated signal generation unit and required for processing an integral multiple of a predetermined processed unit.

5. The multi-channel acoustic signal processing device according to claim 1, wherein said phase adjustment unit is operable to adjust the phase when a pre-echo occurs more than a predetermined detection limit.

6. A multi-channel acoustic signal processing method for dividing an input signal into audio signals of m channels, where m is larger than 1, the input signal being generated by down-mixing the audio signals, said method comprising:

generating a decorrelated signal by performing reverberation processing on the input signal, the decorrelated signal representing a sound represented by the input signal and reverberation; and generating the audio signals of the m channels by performing an arithmetic operation on the input signal and the decorrelated signal generated in said generating of the decorrelated signal, the arithmetic operation using a matrix which indicates a distribution of a signal intensity level and a distribution of the reverberation, wherein said generating of the audio signals includes:

generating an integrated matrix which indicates multiplication of a level distribution matrix by a reverberation adjustment matrix, the level distribution matrix indicating the distribution of the signal intensity level and the reverberation adjustment matrix indicating the distribution of the reverberation; and generating the audio signals of the m channels, by multiplying (i) a matrix indicated by the decorrelated signal and the input signal by (ii) the integrated matrix generated in said generating of the integrated matrix, and wherein said multi-channel acoustic signal processing method further comprises adjusting a phase of the input signal according to the decorrelated signal and the integrated matrix.

7. The multi-channel acoustic signal processing method according to claim 6, wherein in said adjusting, one of the integrated matrix and the input signal which vary as time passes is delayed.

8. The multi-channel acoustic signal processing method according to claim 7, wherein in said adjusting, one of the integrated matrix and the input signal is delayed by a delay time period of the decorrelated signal generated in said generating of the decorrelated signal.

9. The multi-channel acoustic signal processing method according to claim 7, wherein in said adjusting, one of the integrated matrix and the input signal is delayed by a time period which is closest to the delay time period of the decorrelated signal generated by said generating of the decorrelated signal and required for processing an integral multiple of a predetermined processed unit.

10. The multi-channel acoustic signal processing method according to claim 6, wherein in said adjusting, the phase is adjusted when a pre-echo occurs more than a predetermined detection limit.

* * * * *